United States Patent
Noack

(10) Patent No.: US 11,380,400 B2
(45) Date of Patent: Jul. 5, 2022

(54) VOLTAGE SUPPLY CIRCUIT, MEMORY CELL ARRANGEMENT, AND METHOD FOR OPERATING A MEMORY CELL ARRANGEMENT

(71) Applicant: Ferroelectric Memory GmbH, Dresden (DE)

(72) Inventor: Marko Noack, Dresden (DE)

(73) Assignee: FERROELECTRIC MEMORY GMBH, Dresden (DE)

(\*) Notice: Subject to any disclaimer, the term of this patent is extended or adjusted under 35 U.S.C. 154(b) by 0 days.

(21) Appl. No.: 16/861,611

(22) Filed: Apr. 29, 2020

(65) Prior Publication Data
US 2020/0357470 A1 Nov. 12, 2020

(30) Foreign Application Priority Data
May 8, 2019 (DE) .................. 10 2019 111 965.0

(51) Int. Cl.
| | |
|---|---|
| *G11C 16/12* | (2006.01) |
| *G11C 16/26* | (2006.01) |
| *G11C 16/30* | (2006.01) |
| *G11C 5/14* | (2006.01) |
| *G11C 7/10* | (2006.01) |
| *G11C 11/22* | (2006.01) |
| G11C 8/08 | (2006.01) |
| G11C 7/12 | (2006.01) |

(52) U.S. Cl.
CPC .............. *G11C 16/12* (2013.01); *G11C 5/145* (2013.01); *G11C 5/147* (2013.01); *G11C 7/1096* (2013.01); *G11C 11/221* (2013.01); *G11C 11/2297* (2013.01); *G11C 16/26* (2013.01); *G11C 16/30* (2013.01); G11C 7/12 (2013.01); G11C 8/08 (2013.01)

(58) Field of Classification Search
CPC ......... G11C 16/12; G11C 16/26; G11C 16/30; G11C 5/147; G11C 11/2297
See application file for complete search history.

(56) References Cited

U.S. PATENT DOCUMENTS

| | | | | |
|---|---|---|---|---|
| 5,729,493 A | * | 3/1998 | Morton | G11C 16/28 365/185.21 |
| 10,157,644 B1 | * | 12/2018 | Macerola | G06F 1/3203 |

(Continued)

OTHER PUBLICATIONS

European Patent Office, "Search Report" in application No. 20168946.0-1203, dated Sep. 4, 2020, 8 pages.
European Claims in 20168946.0-1203, dated Sep. 2020, 7 pages.

*Primary Examiner* — Mushfique Siddique
(74) *Attorney, Agent, or Firm* — Hickman Becker Bingham Ledesma LLP; Malgorzata A. Kulczycka

(57) ABSTRACT

In various aspects, a voltage supply circuit may include a first controlled voltage converter circuit including a first voltage converter and a first control circuit, wherein the first control circuit is configured to receive an input voltage and control the first voltage converter to output a first output voltage having a predefined relationship to the received input voltage; and a second controlled voltage converter circuit including a second voltage converter and a second control circuit, wherein the second control circuit is configured to receive the first output voltage and control the second voltage converter to output a second output voltage having a predefined relationship to the received first output voltage.

11 Claims, 19 Drawing Sheets

(56) References Cited

U.S. PATENT DOCUMENTS

| | | |
|---|---|---|
| 10,453,541 B1* | 10/2019 | Rowley .................... G05F 1/462 |
| 10,706,943 B2* | 7/2020 | Kim ........................ G11C 16/30 |
| 2006/0109117 A1 | 5/2006 | Hsu et al. |
| 2006/0133149 A1 | 6/2006 | Chae et al. |
| 2010/0164565 A1* | 7/2010 | Takeuchi ............. H03K 17/223 |
| | | 327/143 |
| 2016/0027490 A1 | 1/2016 | Muller |
| 2017/0288533 A1* | 10/2017 | Sandusky ............. H02M 3/073 |
| 2020/0357455 A1* | 11/2020 | Noack ....................... G11C 8/08 |
| 2021/0312969 A1* | 10/2021 | Noack ................. G11C 11/2297 |

* cited by examiner

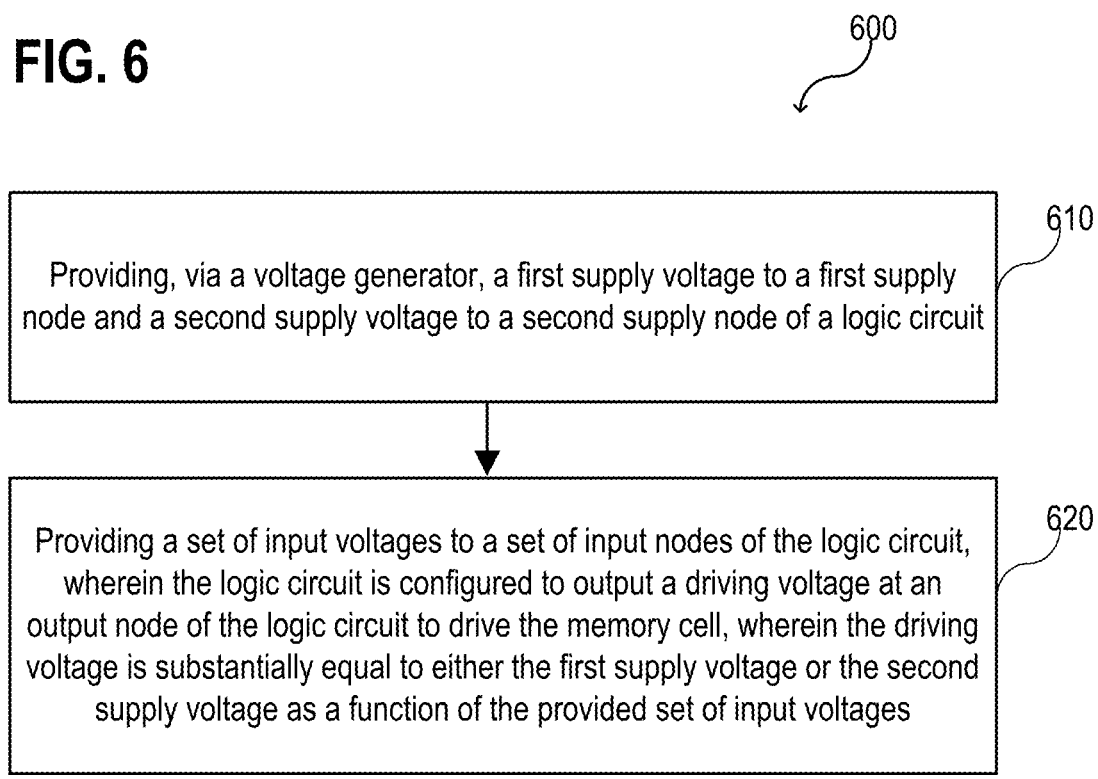

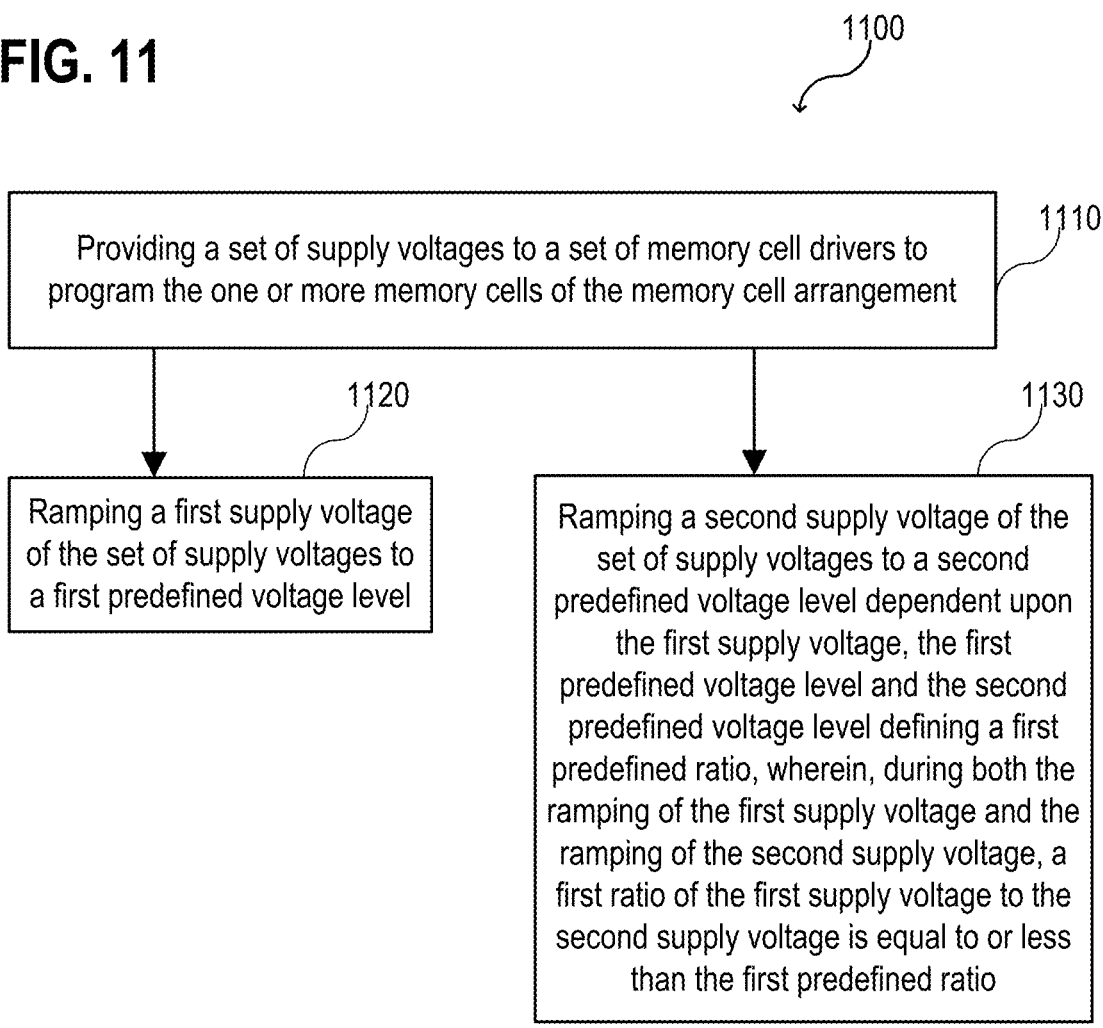

VOLTAGE SUPPLY CIRCUIT, MEMORY CELL ARRANGEMENT, AND METHOD FOR OPERATING A MEMORY CELL ARRANGEMENT

CROSS REFERENCE TO RELATED APPLICATIONS

This application claims the benefit of German Patent Application No. 10 2019 111 965.0 filed May 8, 2019, which is incorporated by reference herein in its entirety.

TECHNICAL FIELD

Various aspects relate to a voltage supply circuit, a memory cell arrangement, and methods thereof, e.g. a method for operating a memory cell arrangement.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is changed, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g. for programming and/or erasing the respective memory cell or groups of memory cells. Therefore, various driver schemes may be used to implement a desired addressing scheme for a plurality of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 6 shows a schematic flow diagram of a method for operating a memory cell, according to various aspects;

FIG. 11 shows a schematic flow diagram of a method for operating a memory cell arrangement, according to various aspects;

DESCRIPTION

Figure 1A:
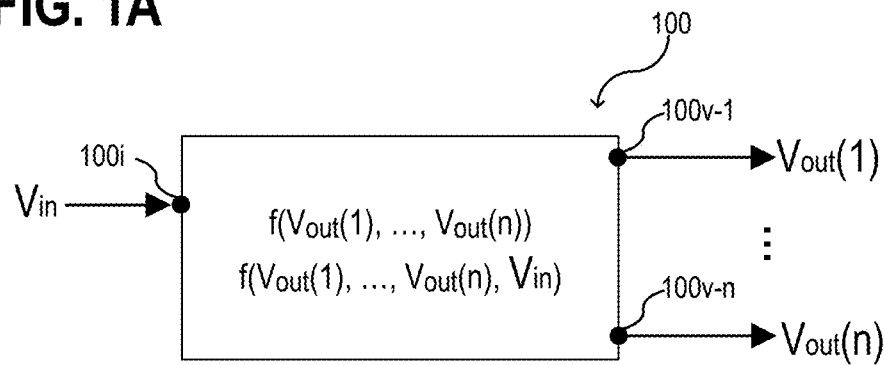
FIGS. 1A to 1C show a voltage supply circuit in various schematic views, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, integrated circuit elements, and the like, to mean electrically connected, which may include a direct connection or an indirect connection, wherein an indirect connection may only include additional structures in the current path that not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term "voltage" may be used herein with respect to "one or more input voltages", "one or more addressing voltages", "one or more output voltages", "one or more supply voltages", and the like. As an example, the term "supply voltage" may be used herein to denote a voltage that is provided to a supply node. As another example, the term "input voltage" may be used herein to denote a voltage that is provided to an input node. Further, the term "output voltage", as example, may be used herein to denote a voltage that is provided to an output node. According to various aspects, the term "substantially equal" may be used herein, for example, with reference to a comparison of two voltages (e.g. of a supply voltage and an output voltage) to mean a deviation of less than 20%, e.g. less than 10%, e.g. less than 5%, e.g. less than 1%.

In some aspects, two voltages may be compared with one another by relative terms such as "greater", "less", or "equal", for example. It is understood that, in some aspects, a comparison may include the sign (positive or negative) of the voltage value or, in other aspects, the absolute voltage values are considered for the comparison. As an example, an n-type (e.g. ferroelectric) field-effect transistor (FET) based memory cell may have a low threshold voltage (LVT) and a high threshold voltage (HVT), wherein the HVT may be greater than the LVT both with respect to the voltage value and the absolute voltage value (e.g. the LVT may be 1 V and the HVT may be 3 V, only as numerical examples) or wherein the HVT may be greater than the LVT only with respect to the voltage value (e.g. the LVT may be −1 V and the HVT may be 1 V, or the LVT may be −2 V and the HVT may be 0 V, or the LVT may be −3 V and the HVT may be −1 V, only as numerical examples). As another example, an p-type (e.g. ferroelectric) field-effect transistor (FET) based memory cell may have a low threshold voltage (LVT) and a high threshold voltage (HVT), wherein the HVT may be lower than the LVT with respect to the voltage value and higher than the LVT with respect to the absolute voltage value (e.g. the LVT may be −1 V and the HVT may be −3 V, only as numerical examples) or wherein the HVT may be lower than the LVT only with respect to the voltage value (e.g. the LVT may be 1 V and the HVT may be −1 V, or the LVT may be 2 V and the HVT may be 0 V, or the LVT may be 3 V and the HVT may be 1 V, only as numerical examples).

According to various aspects, a threshold voltage of a field-effect transistor or a field-effect transistor based memory cell may be a constant-current threshold voltage ($V_{T(ci)}$). In this case, the constant-current threshold voltage ($V_{T(ci)}$) may be a gate-source voltage at which the drain current is equal to a predefined (constant) current ($I_D$). The predefined (constant) current may be a reference current ($I_{D0}$) times the ratio of gate width (W) to gate length (L). The magnitude of the reference current may be selected to be appropriate for a given technology, e.g. 0.1 µA. In some aspects, the constant-current threshold voltage ($V_{T(ci)}$) may be determined based on the following equation:

$$V_{T(ci)}=V_{GS}(\text{at } I_D=I_{D0}W/L).$$

Changing or setting a memory state may be referred to as writing (e.g. programming and/or erasing) the memory cell. In other words, a memory state of one or more memory cells may be changed by one or more write operations. As an example, a first write operation may include changing a memory state of a memory cell from a logic "0" to a logic "1" (also referred to as programming) and a second write operation may include changing a memory state of a memory cell from a logic "1" to a logic "0" (also referred to as erasing). However, the definition of a programming operation and/or an erase operation may be selected arbitrarily. According to various aspects, a memory cell may have at least two distinct states, e.g. with two distinct electrical conductivities that can be determined to determine in which of the at least two distinct states the memory cell is. As an example, a remanent-polarizable memory cell may include a first memory state, e.g. a low threshold voltage state (LVT), and a second memory state, e.g. a high threshold voltage state (HVT). The high threshold voltage state (HVT) may be associated with a lower current flow during read-out than the low threshold voltage state (LVT). In other words, the low threshold voltage state (LVT) may be an electrically conducting state (e.g. associated with a logic "1") and the high threshold voltage state (HVT) may be an electrically non-conducting (or at least less conducting) state (e.g. associated with a logic "0"). However, the definition of the LVT and the HVT and/or the definition of a logic "0" and a logic "1" may be selected arbitrarily.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device.

In some aspects, a non-volatile memory technology may be based on at least one ferroelectric field-effect transistor (FeFET). As an example, a memory cell may include a field-effect transistor (FET) having a ferroelectric material as a gate insulator. As another example, a memory cell may include a field-effect transistor (FET) and a ferroelectric capacitor structure coupled to a gate electrode of the field-effect transistor to provide a ferroelectric field-effect transistor (FeFET) structure. Since a ferroelectric material has at least two stable polarization states, it may be used to shift a threshold voltage of a field-effect transistor in a non-volatile fashion; and, therefore, it may be used to turn the field-effect transistor into a non-volatile field-effect transistor that stores its state in a non-volatile fashion, when power is removed.

In comparison to other emerging memory technologies, a FeFET based memory cell may be integrated in the Front-End-of-Line (FEoL) and/or in the Back-End-of-Line (BEoL) process flow, since it may be implemented as a transistor-type of memory. Accordingly, the integration of the FeFET based memory cell may comply with a standard FEoL and/or BEoL complementary metal-oxide-semiconductor (CMOS) process flow. Consequently, various different integration schemes may be used to integrate a FeFET in different process technologies, e.g., gate-first technologies, gate-last technologies, fully-depleted silicon-on-insulator (FDSOI) technologies, Fin-FET technologies, nanosheet technologies, nanowire technologies, as examples.

According to some aspects, a FeFET based memory cell may include a plurality of (e.g. two) FeFET structures. This allows for an implementation of a ternary memory cell, e.g. a content-addressable memory (CAM) cell. A ternary memory cell may be based on one or more FeFET structures and, therefore, may be integrated together with one or more logic transistors in a CMOS process flow. The integration of one or more FeFET memory cells on a CMOS process platform may be carried out in a gate-first process technology. However, FeFET memory cells may be implemented into other process technologies, wherein different integration schemes may be used. The FeFET memory cells may be integrated, for example, next to one or more logic circuit structures, e.g., next to one or more processor cores on a chip. However, the FeFET memory cells may be integrated independently from other structures. According to various aspects, a FeFET based memory cell may be provided with a feature size equal to or less than about 45 nm.

According to various aspects, a ferroelectric material may be used as part of a memory cell. The ferroelectric material may be or may include ferroelectric $HfO_2$. Ferroelectric $HfO_2$ may include any form of hafnium oxide that may exhibit ferroelectric properties. This may include, for example, pure $HfO_2$, a solid solution of $HfO_2$ and $ZrO_2$ (e.g. but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide.

Various aspects may be related to a remanently-polarizable layer as memory layer or as a functional part of a memory cell. In general, a remanent polarization (also referred to as retentivity or remanence) may be present in a material layer in the case that the material layer may remain polarized upon reduction of an applied electric field (E) to zero; therefore, a certain value for the electrical polarization (P) of the material layer may be detected. Illustratively, a polarization remaining in a material, when the electric field is reduced to zero, may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to described remanent magnetization in magnetic materials.

Further, the term spontaneously polarized or spontaneous polarization may be used with reference to a residual polarization, e.g., the polarization capability of a material beyond dielectric polarization. The coercivity of a material may be a measure of the strength of the reverse polarizing electric field that may be required to remove a remanent polarization. A remanent polarization may be evaluated via analyzing one or more hysteresis measurements (e.g., hysteresis curves), e.g., in a plot of P versus E, in which the material is polarized into opposite directions. The polarization capability of a material (e.g., the dielectric polarization, the spontaneous polarization, and/or the remanent polarization) may be analyzed using capacity spectroscopy, e.g., via a static capacitance-voltage measurement and/or time-resolved capacitance-voltage measurements, by polarization-voltage (P-V) measurements, and/or positive-up-negative-down (PUND) measurements.

In general, a FeFET based memory cell array may be operated based on one or more write operations (e.g. program and/or erase operations) and/or one or more read operations. During a write operation, as example, predefined voltages may be applied at electrical lines (also referred to as control lines or driver lines), wherein the electrical lines may be connected to the respective memory cells to allow for the desired operation. The electrical lines may be referred to as word-lines, source-lines, and/or bit-lines, as examples. One approach to program and/or erase a plurality of memory cells may be a one-third ($\frac{1}{3}$) voltage scheme. Such a $\frac{1}{3}$ voltage scheme may realize that one-third of a programming voltage (the programming voltage may be also referred to as write voltage) is only substantially exceeded at nodes corresponding to one or more memory cells that are intended to be programmed or erased. In other words, all memory cells that are not intended to be written may see a voltage that is substantially equal to or less than one-third of the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g. to provide the desired write voltages and/or the desired read-out voltages.

In some aspects, a voltage ramping scheme may be used, wherein the supply voltages used to program one or more memory cells may be increased by $\frac{1}{3}$ and the supply voltages settle after a settling time.

According to various aspects, a memory cell driver is provided that may be used to control one or more operations (e.g. one or more write operations) of one or more memory cells of a memory cell arrangement. The memory cell driver may be also referred to as memory cell driver circuit (or, abbreviated, as driver circuit). In some aspects, the memory cell driver described herein may be used to efficiently implement a $\frac{1}{3}$ VPP scheme, wherein VPP is a programming voltage that may be used for programming and/or erasing the one or more memory cells. The $\frac{1}{3}$ VPP scheme may include illustratively providing various voltages during a write operation (e.g. during programing and/or erasing) in such a way that only one or more memory cells of the memory cell arrangement that are intended to be written are actually written. In some aspects, a read-out scheme with corresponding read-out voltages may be used during a read operation. The read-out scheme may be different from the writing scheme, e.g. may include different voltages. According to various aspects, a read-out circuit may be used in addition to a writing circuit, wherein the writing circuit may include a plurality of memory cell drivers as described herein. According to other aspects, a read-out circuit and a writing circuit may be implemented into a single read-out/write circuit, wherein the read-out/write circuit includes a plurality of memory cell drivers as described herein.

In some aspects, a memory cell driver may be implemented based on a number of transistors (e.g. in CMOS technology), wherein a design for a memory cell driver is described herein that is based on a minimal number of transistors. This may lead to a lowest possible circuit complexity.

According to various aspects, a driver circuit for a FeFET based memory cell is provided. In some aspects, a memory cell arrangement is provided that includes a plurality of memory cells (e.g. a plurality of a FeFET based memory cells), wherein a plurality of memory cell drivers is used to drive (in other words to operate or to control an operation of)

the memory cell arrangement. According to various aspects, the memory cell drivers may be connected with the plurality of memory cells in an array configuration. As an example, a first set of (m) memory cell drivers and a second set of (n) memory cell drivers may be used to individually address each memory cell of an array A(n,m) with n times m memory cells. It is understood that m may be an integer number greater than one and that n may be an integer number greater than one.

According to various aspects, a plurality of coupled feedback loops may be used to control a plurality of charge pumps to generate and output a plurality of output voltages. According to various aspects, each output voltage (e.g. provided at a corresponding output node) may be assigned to a corresponding charge pump and/or charge pump stage. The output voltage provided by the corresponding charge pump may be used as an input voltage of a following charge pump that generates a higher output voltage than the previous charge pump. This dependency may ensure that the output voltage of higher charge pump stages (e.g. charge pump stages delivering a higher voltage than lower charge pump stages) may not exceed a predefined voltage (e.g., VPP/3), which may be a requirement for reliable write operations of a memory cell or memory cell arrangement, e.g. of a FeFET memory cell or a FeFET memory cell arrangement.

FIG. 1A shows a voltage supply circuit 100 in a schematic view, according to various aspects. The voltage supply circuit 100 may be or may include a voltage generator, and/or a voltage converter, and the like. In some aspects, the voltage supply circuit 100 may be used to provide a plurality of supply voltages to a memory driver, e.g. to provide two supply voltages to a memory driver 300 as shown, for example, in FIG. 3. In some further aspects, the voltage supply circuit 100 may be used to provide a plurality of supply voltages to a plurality of memory drivers of a memory cell arrangement. As an example, the voltage supply circuit 100 may be used to supply four supply voltages to a plurality of memory drivers 300 of a memory cell arrangement 400, 500, as shown, for example, in FIG. 4A, FIG. 4B, and FIGS. 5A to 5D. In some aspects, one of the supply voltages may be zero volt or any suitable reference voltage (e.g. the ground voltage). In other aspects, each of the supply voltages may be different from zero volt or the reference voltage (e.g. the ground voltage).

According to various aspects, the voltage supply circuit 100 may be configured to receive an input voltage $V_{in}$. The input voltage $V_{in}$ may be provided to an input node 100$i$ of the voltage supply circuit 100. The voltage supply circuit 100 may be further configured to generate a plurality of output voltages $V_{out}(1, \ldots, n)$. According to various aspects, each of the plurality of output voltages $V_{out}(1, \ldots, n)$ may be provided to a corresponding output node 100$v$-(1, \ldots, n) of the voltage supply circuit 100. As an example, a number of n output voltages $V_{out}(1, \ldots, n)$ may be provided, wherein n is an integer greater than 1 (e.g. 2, 3, 4, or more than 4). According to various aspects, each of the n output voltages $V_{out}(1, \ldots, n)$ may be dependent from at least another one of the n output voltages $V_{out}(1, \ldots, n)$. In other words, the voltage supply circuit 100 may be configured to provide then output voltages $V_{out}(1, \ldots, n)$ with a predefined relationship $f(V_{out}(1), \ldots, V_{out}(n))$ to one another. In some aspects, the voltage supply circuit 100 may be configured to provide the n output voltages $V_{out}(1, \ldots, n)$ with a predefined relationship $f(V_{out}(1), \ldots, V_{out}(n), V_{in})$ to one another and with a predefined relationship to the input voltage $V_{in}$. According to various aspects, each of the n output voltages $V_{out}(1, \ldots, n)$ may be different from each of the other n output voltages $V_{out}(1, \ldots, n)$.

According to various aspects, the predefined relationship $f(V_{out}(1), \ldots, V_{out}(n))$ may include one or more predefined ratios of respectively two output voltages of the n output voltages $V_{out}(1, \ldots, n)$. As an example, for a number of n output voltages $V_{out}(1, \ldots, n)$ a number of at least n−1 predefined ratios may be used to provide then output voltages $V_{out}(1, \ldots, n)$ with a predefined relationship to one another.

According to various aspects, the predefined relationship $f(V_{out}(1), \ldots, V_{out}(n), V_{in})$ may include one or more predefined ratios of respectively two output voltages of the n output voltages $V_{out}(1, \ldots, n)$ and at least one predefined ratio of the input voltage $V_{in}$ to at least one of then output voltages $V_{out}(1, \ldots, n)$. As an example, for a number of n output voltages $V_{out}(1, \ldots, n)$ at least the same number of predefined ratios may be used to provide the n output voltages $V_{out}(1, \ldots, n)$ with a predefined relationship to one another and with a predefined relationship to the input voltage $V_{in}$.

According to various aspects, the voltage supply circuit 100 may be configured to provide then output voltages $V_{out}(1, \ldots, n)$ with their predefined ratios after the n output voltages $V_{out}(1, \ldots, n)$ are ramped up. Further, the voltage supply circuit 100 may be configured to provide the n output voltages $V_{out}(1, \ldots, n)$ with a ratio that not exceeds their predefined ratios during the n output voltages $V_{out}(1, \ldots, n)$ are ramped up. The ramping of then output voltages $V_{out}(1, \ldots, n)$ may be defined by a ramping of the input voltage $V_{in}$. As an example, in the case that the input voltage $V_{in}$ may be increased with a predefined percentage, each of the n output voltages $V_{out}(1, \ldots, n)$ may be increased with the same percentage.

Various aspects of a voltage supply circuit 100 may be shown in FIG. 1B and FIG. 1C and FIGS. 2A to 2G. According to various aspects, the voltage supply circuit 100 may include a plurality of controlled voltage converter circuits 101-(1, \ldots, n) to output a plurality of output voltages $V_{out}(1, \ldots, n)$. The voltage supply circuit 100 may be configured to provide the plurality of output voltages $V_{out}(1, \ldots, n)$ with a predefined relationship to one another, e.g. as described with reference to then output voltages $V_{out}(1, \ldots, n)$ in FIG. 1A.

According to various aspects, the output voltage $V_{out}$ of each of the plurality of controlled voltage converter circuits 101-(1, \ldots, n) may be output by the voltage supply circuit 100 to supply one or more electronic components, e.g. to supply one or more memory cell drivers of a memory cell arrangement.

Figure 1B:
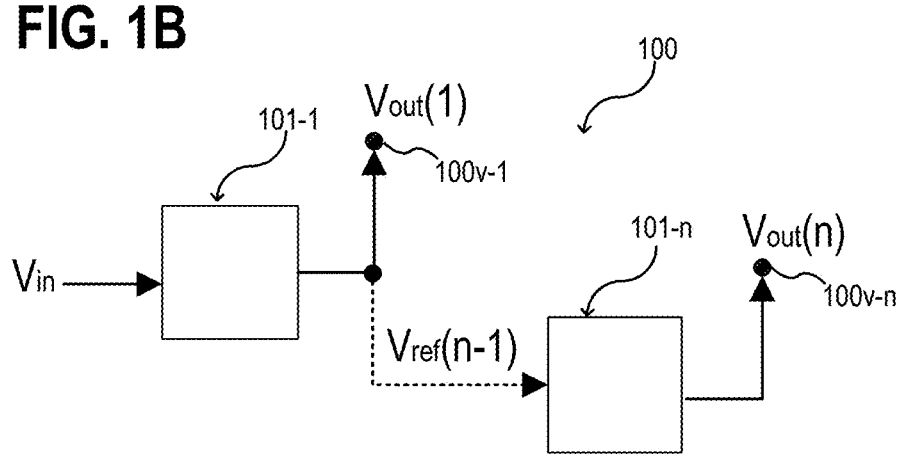

FIG. 1B shows the voltage supply circuit 100 in a schematic view, according to various aspects. The voltage supply circuit 100 may include a number of n controlled voltage converter circuits 101-(1, \ldots, n) coupled to one another in a series connection. As an example, a first controlled voltage converter circuit 101-1 may receive an input voltage $V_{in}$ and may generate a first output voltage $V_{out}(1)$, wherein a second controlled voltage converter circuit may receive the generated first output voltage $V_{out}(1)$ as an input voltage and may generate a second output voltage $V_{out}(2)$, the generated second output voltage $V_{out}(2)$ may be higher than the generated first output voltage $V_{out}(1)$. An n-th controlled voltage converter circuit 101-$n$ may receive the (n−1)-th output voltage $V_{out}(n-1)$ (illustratively as an (n−1)-th reference voltage $V_{ref}(n-1)$) and may provide an n-th output voltage $V_{out}(n)$. The n controlled voltage converter circuits 101-(1, \ldots, n) of the voltage supply circuit 100 may be configured such that the first output voltage $V_{out}(1)$ may have a predefined relationship (e.g. a predefined ratio) to the input voltage $V_{in}$ and such that the n-th output voltage $V_{out}(n)$ may have a predefined relationship (e.g. a predefined ratio) to the (n−1)-th output voltage $V_{out}(n-1)$. The generated n-th output voltage $V_{out}(n)$ may be higher than the generated f the (n−1)-th output voltage $V_{out}(n-1)$.

Figure 1C:
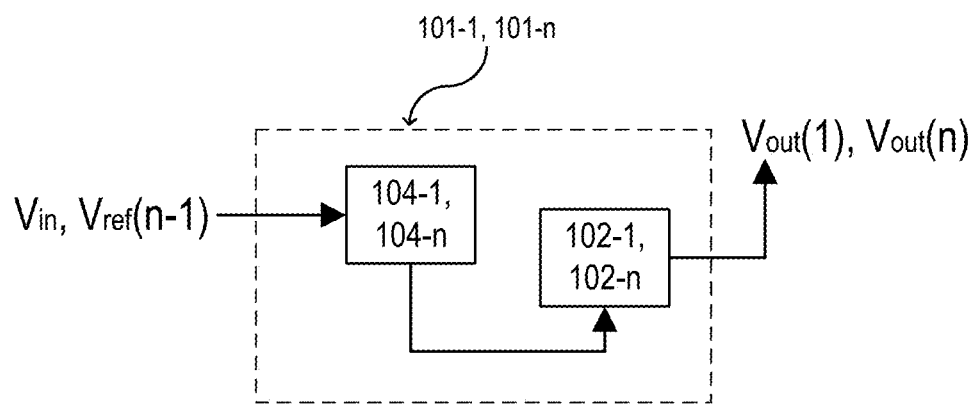

FIG. 1C shows a controlled voltage converter circuit 101-1, 101-n of a voltage supply circuit 100 in a schematic view, according to various aspects. The controlled voltage converter circuit 101-1, 101-n may include a voltage converter 102-1, 102-n and a control circuit 104-1, 104-n.

According to various aspects, in the case that the controlled voltage converter circuit is a first controlled voltage converter circuit 101-1 of a voltage supply circuit 100, the input voltage $V_{in}$ may be provided to the control circuit 104-1 and the control circuit 104-1 may be configured to control the voltage converter 102-1 to output the first output voltage $V_{out}(1)$ based on the received input voltage $V_{in}$. The received input voltage $V_{in}$ may be an external reference voltage. In the case that the controlled voltage converter circuit is an n-th (e.g. a second, a third, a fourth, etc.) controlled voltage converter circuit 101-n of a voltage supply circuit 100, a corresponding (illustratively internal) reference voltage $V_{ref}(n-1)$ may be provided to the control circuit 104-n and the control circuit 104-n may be configured to control the voltage converter 102-n to output the n-th output voltage $V_{out}(n)$ based on the received reference voltage $V_{ref}(n-1)$.

According to various aspects, the respective control circuit 104-1, 104-n may include a voltage divider to provide a feedback voltage representing the output voltage $V_{out}(1)$, $V_{out}(n)$ of the corresponding voltage converter 102-1, 102-n and a comparator to compare the feedback voltage with the received input voltage $V_{in}$ or reference voltage $V_{ref}(n-1)$. The control circuit 104-1, 104-n may be configured to control an increase of the output voltage $V_{out}(1)$, $V_{out}(n)$ until the feedback voltage is, for example, equal to the received input voltage $V_{in}$ or reference voltage $V_{ref}(n-1)$. As an example, the comparator may output a control signal dependent upon the comparison of the feedback voltage and the received input voltage $V_{in}$ or reference voltage $V_{ref}(n-1)$. The control signal may control the corresponding voltage converter 102-1, 102-n. The voltage converter 102-1, 102-n may be a charge pump and the control signal may enable or disable a pump up of the corresponding output voltage $V_{out}(1)$, $V_{out}(n)$ by the charge pump. According to various aspects, the voltage divider of the control circuit 104-1, 104-n may define a predefined ratio of the output voltage $V_{out}(1)$, $V_{out}(n)$ to the input voltage $V_{in}$ or reference voltage $V_{ref}(n-1)$.

According to various aspects, the respective control circuit 104-1, 104-n may be configured as a closed-loop control circuit having a voltage divider to provide a first feedback voltage representing the respective output voltage $V_{out}(1)$, $V_{out}(n)$ to a comparator to compare the feedback voltage with the input voltage $V_{in}$ or reference voltage $V_{ref}(n-1)$. The control circuit 104-1, 104-n may be further configured to control the corresponding voltage converter 102-1, 102-n to output the output voltage $V_{out}(1)$, $V_{out}(n)$ in response to a control voltage generated by the comparator.

According to various aspects, the respective voltage converter 102-1, 102-n may be or may include a charge pump. In some aspects, the respective voltage converter 102-1, 102-n may include a plurality of charge pumps. Illustratively, the voltage supply circuit 100 may include various charge pumps coupled in series with one another so that each of the charge pumps provides a charge pump stage, wherein the voltage of each charge pump stage is output by the voltage supply circuit 100 to supply one or more electronic components. Therefore, one or more electronic components may be supplied with a plurality of voltages $V_{out}(1, n)$ being dependent from each other.

Figure 2A:
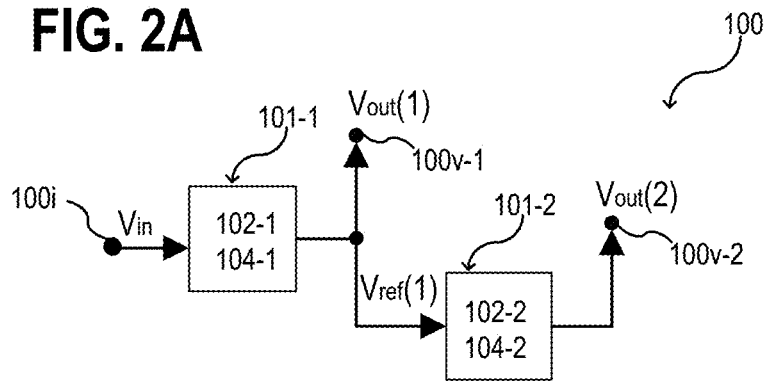
FIGS. 2A to 2G show a voltage supply circuit in various schematic views, according to various aspects.

As exemplarily illustrated in FIG. 2A in a schematic view, the voltage supply circuit 100 may include a first controlled voltage converter circuit 101-1 and a second controlled voltage converter circuit 101-2 coupled to one another in series. In this case, the first controlled voltage converter circuit 101-1 may receive an input voltage $V_{in}$ and may provide a first output voltage $V_{out}(1)$, wherein the second controlled voltage converter circuit 101-2 may receive the first output voltage $V_{out}(1)$ (illustratively as a reference voltage $V_{ref}(1)$) and may provide a second output voltage $V_{out}(2)$. The first controlled voltage converter circuit 101-1 and the second controlled voltage converter circuit 101-2 may be configured such that the first output voltage $V_{out}(1)$ may have a predefined relationship (e.g. a predefined ratio) to the input voltage $V_{in}$ and the second output voltage $V_{out}(2)$ may have a predefined relationship (e.g. a predefined ratio) to the first output voltage $V_{out}(1)$.

Figure 2B:
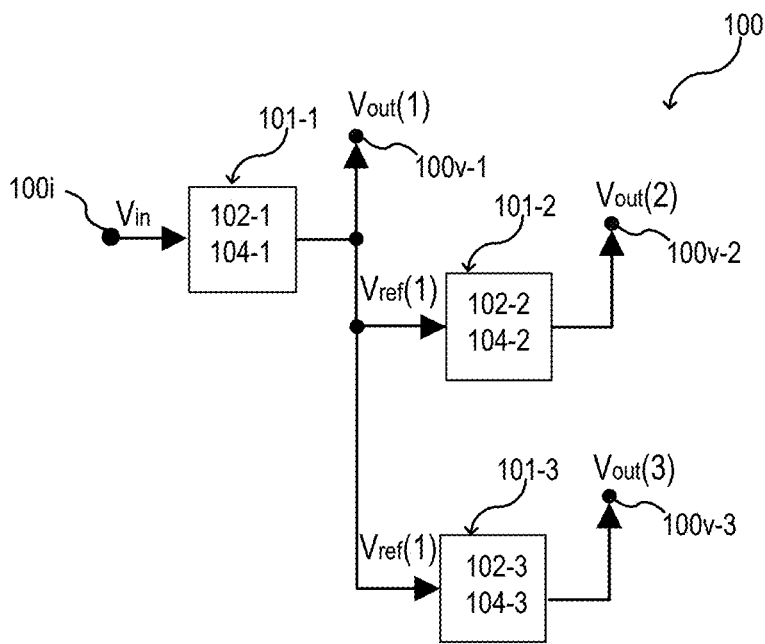
Figure 2C:
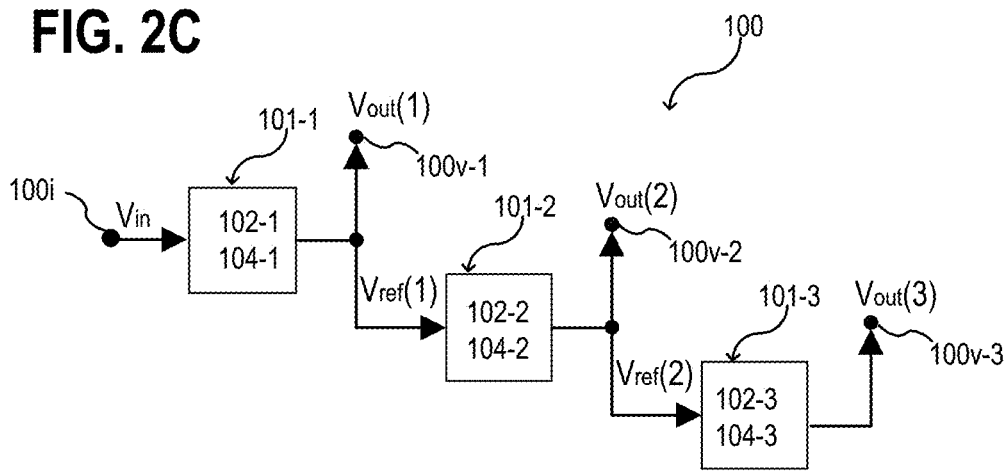
Figure 2D:
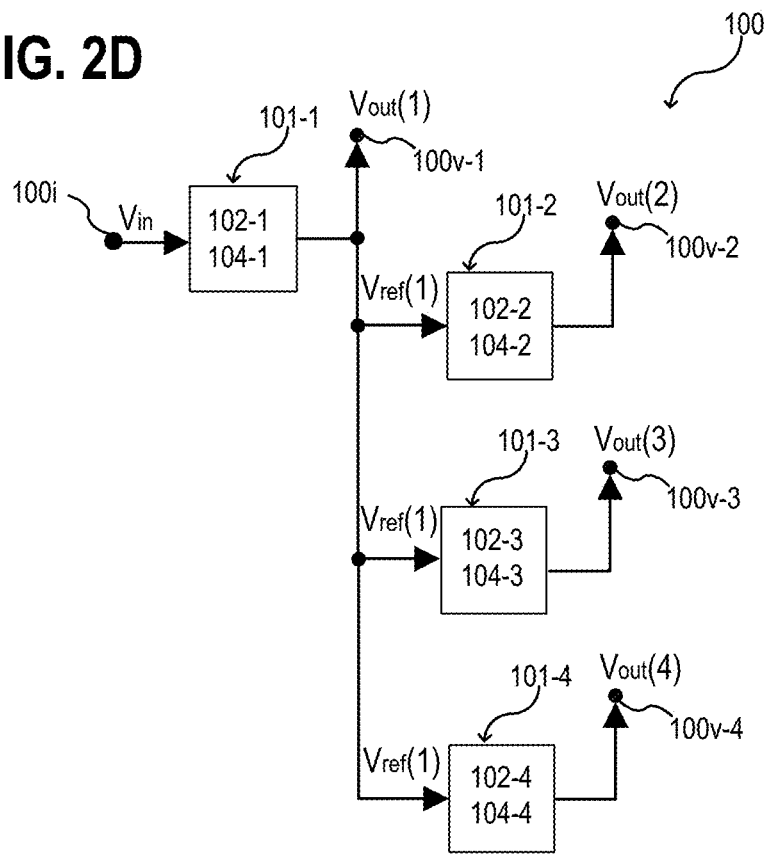
Figure 2E:
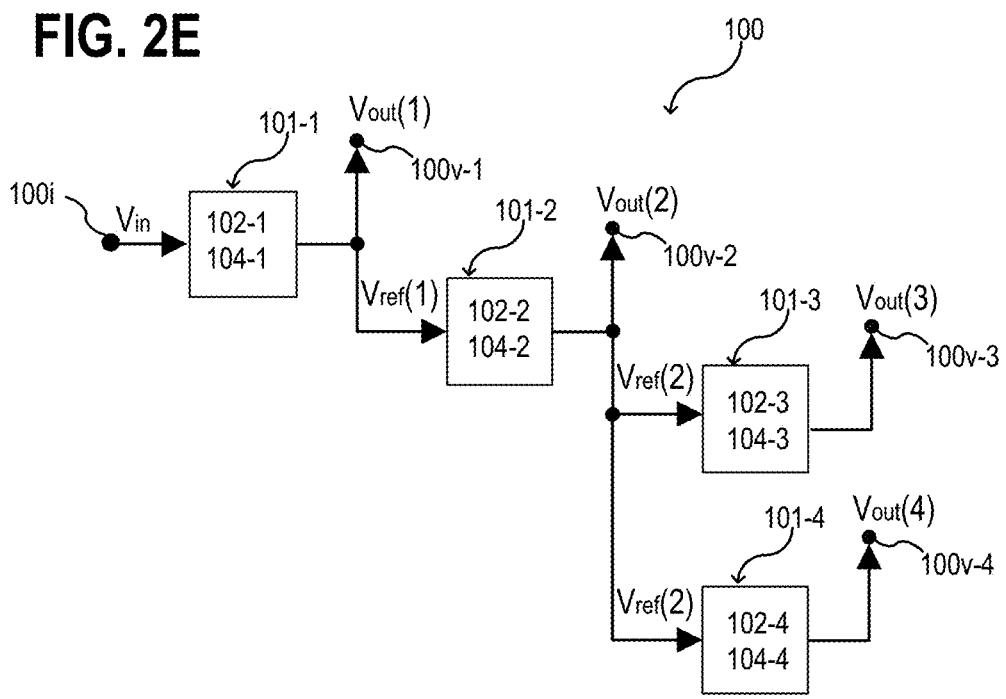
Figure 2F:
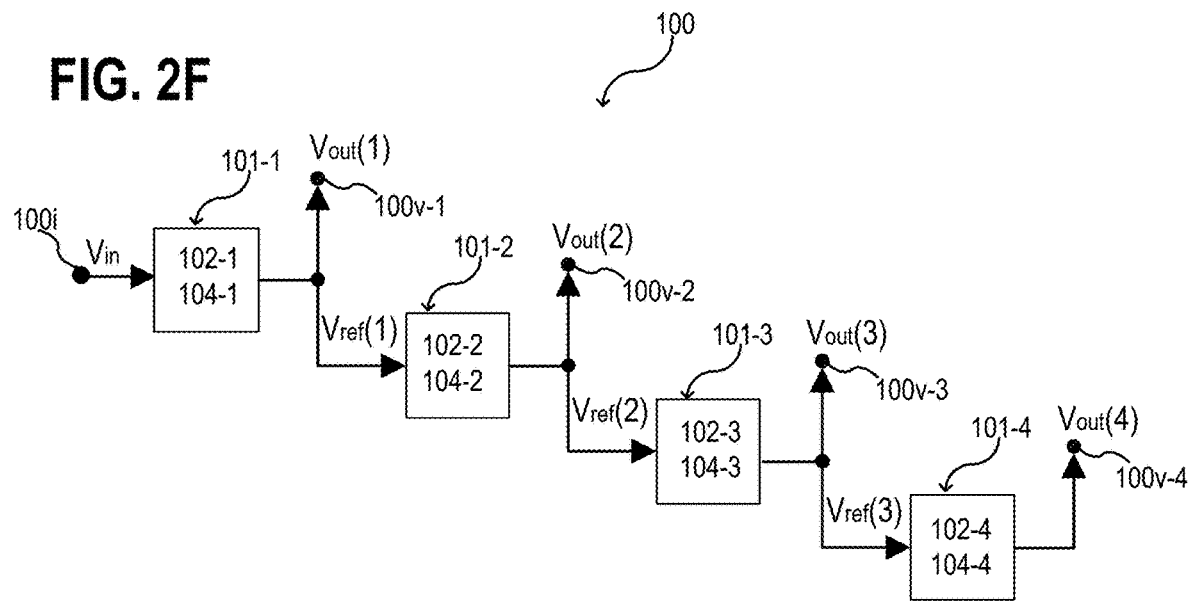
Figure 2G:
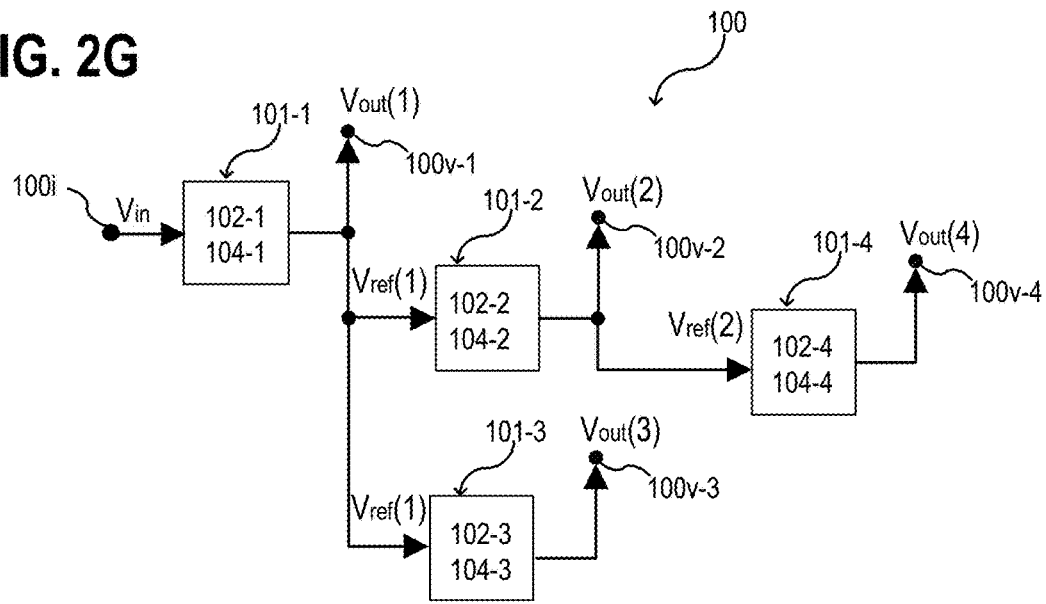

FIG. 2B and FIG. 2C show a voltage supply circuit 100 in a schematic view, according to various aspects. The voltage supply circuit 100 may include a first controlled voltage converter circuit 101-1, a second controlled voltage converter circuit 101-2, and a third controlled voltage converter circuit 101-3. The first controlled voltage converter circuit 101-1 and the second controlled voltage converter circuit 101-2 may be coupled to one another in series. The third controlled voltage converter circuit 101-3 and may be coupled either to the first controlled voltage converter circuit 101-1 (see FIG. 2B) or to the second controlled voltage converter circuit 101-2 (see FIG. 2C) in series.

According to various aspects, the first controlled voltage converter circuit 101-1 may receive an input voltage $V_{in}$ and may provide a first output voltage $V_{out}(1)$, wherein the second controlled voltage converter circuit 101-2 may receive the first output voltage $V_{out}(1)$ (illustratively as a first reference voltage $V_{ref}(1)$) and may provide a second output voltage $V_{out}(2)$, and wherein the third controlled voltage converter circuit 101-3 may receive the first output voltage $V_{out}(1)$ or the second output voltage $V_{out}(2)$ and may provide a third output voltage $V_{out}(3)$. Illustratively, the third controlled voltage converter circuit 101-3 may receive the same reference voltage $V_{ref}(1)$ as the second controlled voltage converter circuit 101-2 or may receive a second reference voltage $V_{ref}(2)$. The first controlled voltage converter circuit 101-1, the second controlled voltage converter circuit 101-2, and the third controlled voltage converter circuit 101-3 may be configured such that the first output voltage $V_{out}(1)$ may have a predefined relationship (e.g. a predefined ratio) to the input voltage $V_{in}$, the second output voltage $V_{out}(2)$ may have a predefined relationship (e.g. a predefined ratio) to the first output voltage $V_{out}(1)$, and the third output voltage $V_{out}(3)$ may have a predefined relationship (e.g. a predefined ratio) to the first output voltage $V_{out}(1)$ or the second output voltage $V_{out}(2)$.

FIG. 2D, FIG. 2E, FIG. 2F, and FIG. 2G show a voltage supply circuit 100 in a schematic view, according to various aspects. The voltage supply circuit 100 may include a first controlled voltage converter circuit 101-1, a second controlled voltage converter circuit 101-2, a third controlled voltage converter circuit 101-3, and a fourth controlled voltage converter circuit 101-4. At least two of the four voltage converter circuits 101-(1, 2, 3, 4) may be coupled to one another in series.

According to various aspects, the first controlled voltage converter circuit 101-1 may receive an input voltage $V_{in}$ and may provide a first output voltage $V_{out}(1)$. The second controlled voltage converter circuit 101-2 may receive the first output voltage $V_{out}(1)$ (illustratively as a first reference voltage $V_{ref}(1)$) and may provide a second output voltage $V_{out}(2)$. The third controlled voltage converter circuit 101-3 may receive the first output voltage $V_{out}(1)$ (see FIG. 2D and FIG. 2G) or the second output voltage $V_{out}(2)$ (see FIG. 2E and FIG. 2F) and may provide a third output voltage $V_{out}(3)$. Further, the fourth controlled voltage converter circuit 101-4 may receive one of the first output voltage $V_{out}(1)$, the second output voltage $V_{out}(2)$, or the third output voltage $V_{out}(3)$ and may provide a fourth output voltage $V_{out}(4)$. Illustratively, the fourth controlled voltage converter circuit 101-4 may receive the same reference voltage $V_{ref}(1)$ as both the second controlled voltage converter circuit 101-2 and the third controlled voltage converter circuit 101-3 (see FIG. 2D), the fourth controlled voltage converter circuit 101-4 may receive the same reference voltage $V_{ref}(2)$ as the third controlled voltage converter circuit 101-3 (see FIG. 2E), the fourth controlled voltage converter circuit 101-4 may receive a third reference voltage $V_{ref}(3)$ (see FIG. 2F), or the fourth controlled voltage converter circuit 101-4 may receive a second reference voltage $V_{ref}(2)$ in the case that the third controlled voltage converter circuit 101-3 may receive the first reference voltage $V_{ref}(1)$ (see FIG. 2G). The first controlled voltage converter circuit 101-1, the second controlled voltage converter circuit 101-2, the third controlled voltage converter circuit 101-3, and the fourth controlled voltage converter circuit 101-4 may be configured such that the first output voltage $V_{out}(1)$ may have a predefined relationship (e.g. a predefined ratio) to the input voltage $V_{in}$, the second output voltage $V_{out}(2)$ may have a predefined relationship (e.g. a predefined ratio) to the first output voltage $V_{out}(1)$, the third output voltage $V_{out}(3)$ may have a predefined relationship (e.g. a predefined ratio) to the first output voltage $V_{out}(1)$ or the second output voltage $V_{out}(2)$, and the fourth output voltage $V_{out}(4)$ may have a predefined relationship (e.g. a predefined ratio) to the first output voltage $V_{out}(1)$, the second output voltage $V_{out}(2)$, or the third output voltage $V_{out}(3)$.

Figure 3:
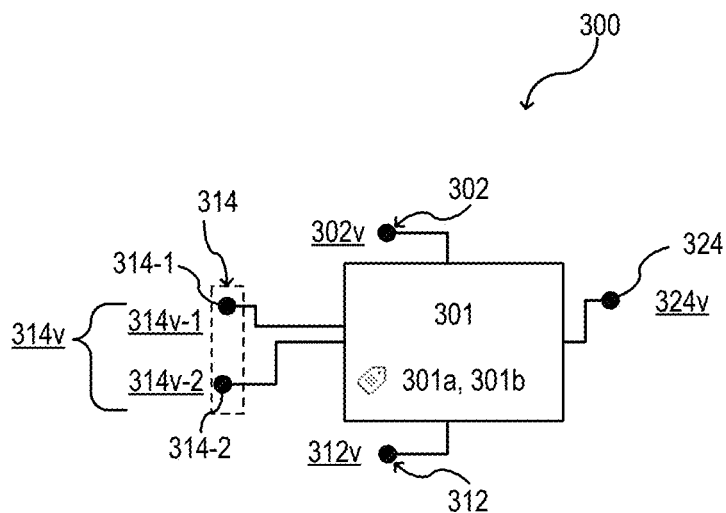
FIG. 3 shows a memory cell driver for driving a memory cell in a schematic view, according to various aspects.

FIG. 3 shows a memory cell driver 300 in a schematic view, according to various aspects. The memory cell driver 300 may include a logic circuit 301. The memory cell driver 300 may further include a first supply node 302 to receive a first supply voltage 302v and a second supply node 312 to receive a second supply voltage 312v. The memory cell driver 300 may further include a plurality of addressing nodes 314 to receive a plurality of addressing voltages 314v. As an example, the memory cell driver 300 may include at least two addressing nodes 314-1, 314-2 to receive at least two addressing voltages 314v-1, 314v-2. The memory cell driver 300 may further include a driving node 324. As an example, the driving node 324 of the memory cell driver 300 may be used to output a driving voltage 324v to a single control-line (e.g. to a word-line, to a source-line, to a bit-line, etc.). As another example, the driving node 324 may be used to output a driving voltage 324v to more than one control-line (e.g. to both a source-line and a bit-line).

According to various aspects, the plurality of addressing nodes 314 may be used to control whether the logic circuit 301 is in a first operating state 301a or in a second operating state 301b. Further, the plurality of addressing nodes 314 may be used to address one or more memory cells connected (e.g. electrically conductively connected) to the driving node 324 of the memory cell driver 300.

According to various aspects, the logic circuit 301 may be connected (e.g. electrically conductively connected) to the first supply node 302, the second supply node 312, the plurality of addressing nodes 314, and the driving node 324. In some aspects, the first supply node 302 and the second supply node 312 may be used to supply the respective supply voltages to the logic circuit 301. In some aspects, the plurality of addressing nodes 314 may be used to provide logic input states to the logic circuit 301 and the driving node 324 may be used to output one logic output state via the logic circuit 301 based on the logic operation defined by the logic circuit 301 and on the provided logic input states. The logic input states may be represented by the plurality of addressing voltages 314v.

According to various aspects, the logic circuit 301 may include one or more logic gates and may be configured to connect (e.g. electrically conductively connect), via the one or more logic gates in response to the plurality of addressing voltages 314v, either the first supply node 302 or the second supply node 312 to the driving node 324. Illustratively, the supply voltages 302v, 312v that are used to operate the logic circuit 301 may be used at the same time to provide a driving voltage 324v at the driving node 324, wherein the driving voltage 324v is similar to either the first supply voltage 302v or the second supply voltage 312v. As an example, a deviation of the driving voltage 324v from the respective supply voltage 302v, 312v may be less than 10%, e.g. less than 5%, e.g. less than 1%.

Figure 4A:
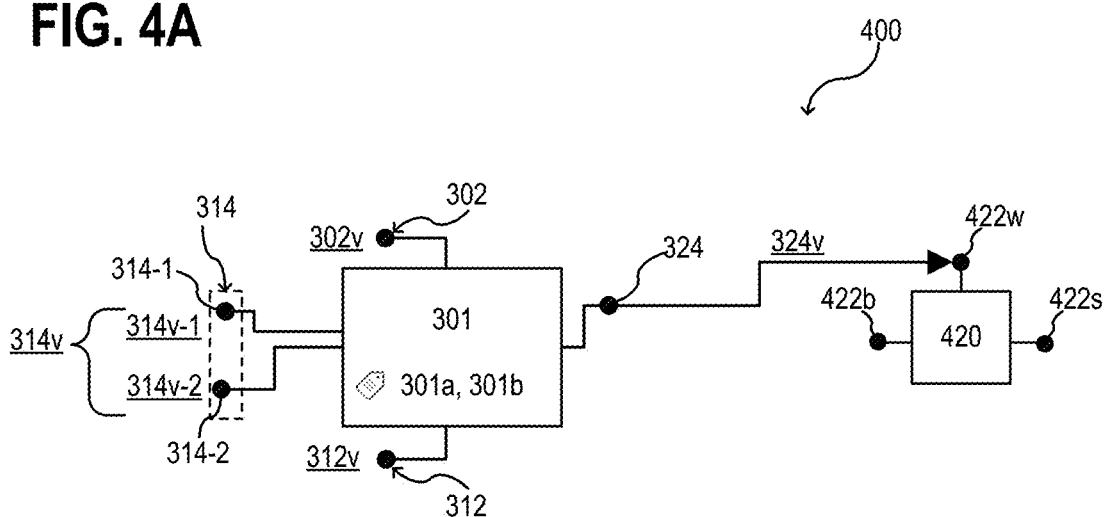
FIG. 4A and FIG. 4B schematically show a memory cell arrangement including a memory cell and a memory cell driver for driving the memory cell, according to various aspects.

FIG. 4A shows a memory cell arrangement 400 including a memory cell driver 300 and a memory cell 420, wherein a driving node 324 of the memory cell driver 300 is (e.g. electrically conductively) connected to a control node 422w of the memory cell 420. According to various aspects, one of the supply voltages 302v, 312v may be used to operate (e.g. to program) the memory cell 420. According to various aspects, no more than either the first supply voltage 302v or the second supply voltage 312v (that may be supplied to the memory cell driver 300) may be supplied to the control node 422w of the memory cell 420 during a writing of the memory cell 420. As illustrated in FIG. 4A, the control node 422w may be a first control node of the memory cell 420, e.g. a word-line node. However, the control node may be any other node of the memory cell 420. According to various aspects, the memory cell 420 may include one or more additional control nodes 422s, 422b, e.g. a source-line node 422s and a bit-line node 422b.

Figure 4B:
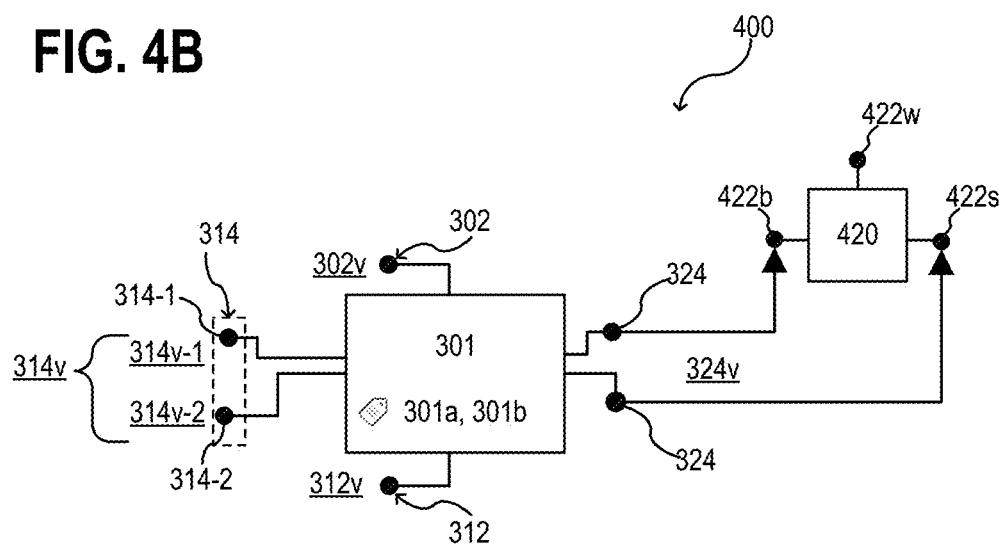

FIG. 4B shows a memory cell arrangement 400 including a memory cell driver 300 and a memory cell 420, wherein a driving node 324 of the memory cell driver 300 is electrically conductively connected to two control nodes 422s, 422b of the memory cell 420. According to various aspects, one of the supply voltages 302v, 312v may be used to operate (e.g. to program) the memory cell 420. According to various aspects, no more than either the first supply voltage 302v or the second supply voltage 312v (that may be supplied to the memory cell driver 300) may be supplied to the two control nodes 422s, 422b during a writing of the memory cell 420.

The memory cell 420 illustrated in FIG. 4A and FIG. 4B may be a three terminal memory cell, i.e. the memory cell may be operated via three control nodes 422w, 422s, 422b also referred to as word-line node 422w, source-line node 422s, and bit-line node 422b. In the case that the memory cell 420 is a FeFET based memory cell, e.g. in the case that the memory cell 420 includes at least one FeFET to store information, the word-line node 422w may be connected to a gate region (or gate electrode) of the at least one FeFET, the source-line node 422s may be connected to a source region (or source electrode) of the at least one FeFET, and the bit-line node 422b may be connected to a drain region (or drain electrode) of the at least one FeFET.

Figure 5A:
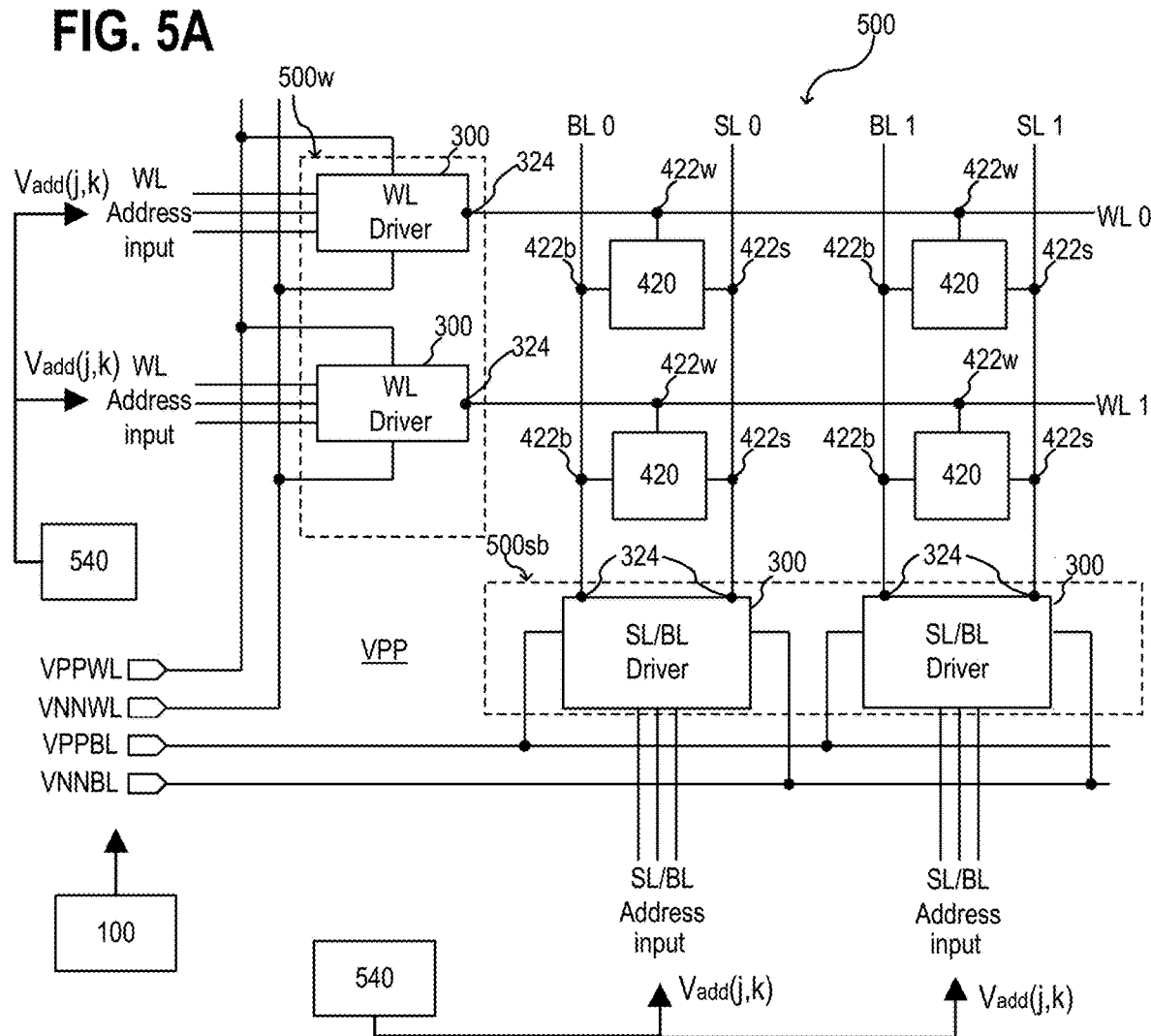
FIG. 5A shows a memory cell arrangement in a schematic view, according to various aspects.
Figure 5B:
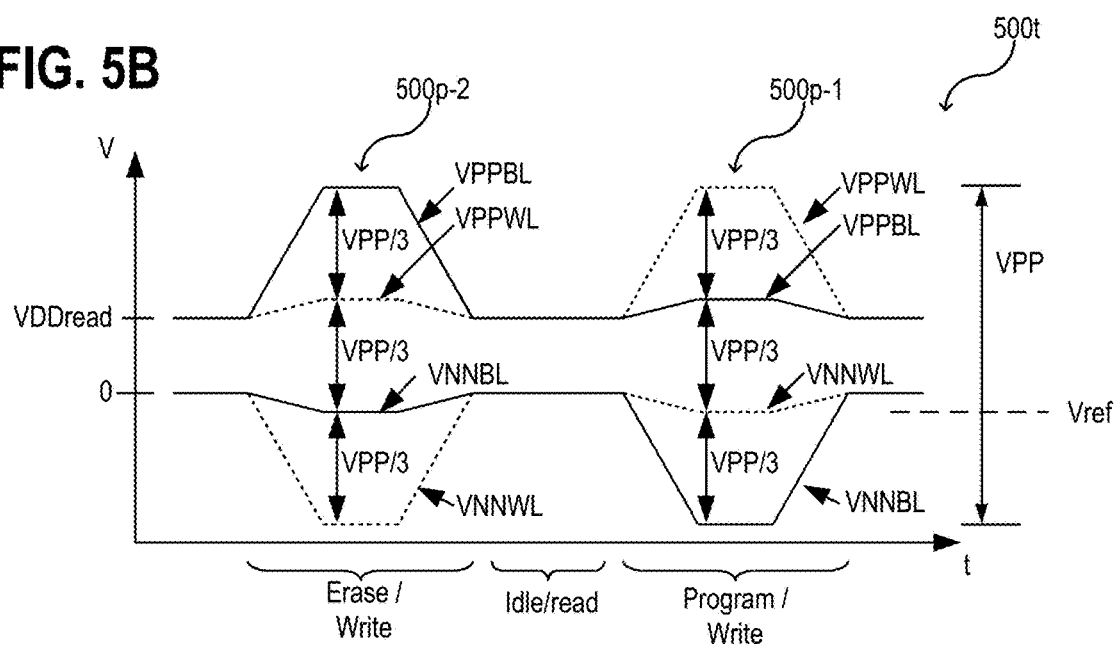
FIG. 5B shows a timing diagram of supply voltages for operating a memory cell arrangement, according to various aspects.

FIG. 5A shows a memory cell arrangement 500 in a schematic view, according to various aspects. FIG. 5B shows exemplarily a timing diagram 500t for four supply voltages used to supply memory cell drivers 300 and to operate (e.g. to program) the memory cell arrangement 500, according to various aspects. The four supply voltages may include two supply voltages VPPWL, VNNWL associated with word-line drivers (WL Driver) and two supply voltages VPPBL, VNNBL associated with the source/bit-line drivers (SL/BL Driver).

As exemplarily illustrated in FIG. 5A, the memory cell arrangement 500 may include a plurality of memory cell drivers 300 to drive (in other words to operate or to control an operation of, e.g. to program) a plurality of memory cells 420. As an example, the memory cell arrangement 500 may include a first set of memory cell drivers 500w and a second set of memory cell drivers 500sb. Each memory cell driver of the memory cell arrangement 500 may be configured, for example, as described herein with reference to the memory cell driver 300.

According to various aspects, the driving node 324 of each memory cell driver 300 of the first set of memory cell drivers 500w may be connected to a first control-line (WL0, WL1). As an example, the memory cell driver 300 of the first set of memory cell drivers 500w may be word-line (WL) drivers, and each of the word-line drivers may be connected to a word-line (WL). According to various aspects, the driving node 324 of each memory cell driver 300 of the second set of memory cell drivers 500sb may be connected to one or more second control-lines (SL0, SL1, BL0, BL1). As an example, the memory cell drivers 300 of the second set of memory cell drivers 500sb may be source/bit-line (SL/BL) drivers and each of the source/bit-line drivers may be connected to at least one source-line (SL) and at least one bit-line (BL).

According to various aspects, each memory cell 420 of the memory cell arrangement 500 may include one or more first control nodes 422w and one or more second control nodes 422s, 422b, wherein the one or more first control nodes 422w and the one or more second control nodes 422s, 422b of each of the plurality of memory cells 420 are connected to the one or more first control-lines (WL) of a corresponding memory cell driver 300 of the first set of memory cell drivers 500w and the one or more second control-lines (SL, BL) of a corresponding memory cell driver 300 of the second set of memory cell drivers 500sb respectively.

FIG. 5A illustrates memory cells 420 that may be operated via three control nodes. As an example, a FeFET based memory cell may include a single FeFET operated via three control nodes, e.g. via a word-line node 422w (also referred to as gate-node) connected to a corresponding word-line (WL) to apply a voltage at the gate of the FeFET, a source-line node 422s (also referred to as source node) connected to a corresponding source-line (SL) to apply a voltage at a source of the FeFET, and a bit-line node 422b (also referred to as drain node) connected to a corresponding bit-line (BL) to apply a voltage at the drain of the FeFET, see, for example, FIG. 5A. As another example, the FeFET based memory cell may include two FeFETs coupled in series or in parallel with one another and operated via four control nodes, e.g. via two word-line nodes to connect each gate of the two FeFETs to a corresponding word-line, a source-line node to connect a source of at least one of the two FeFETs to a source-line, and a bit-line node to connect a drain of at least one of the two FeFETs to a bit-line, see, for example, FIG. 8A and FIG. 8B.

According to various aspects, the number of memory cell drivers 300 that may be used to operate (e.g. to program) each memory cell 420 of the memory cell arrangement 500 may be selected as desired. In one configuration, each memory cell 420 of the memory cell arrangement 500 may be connected to one memory cell driver 300 of the first set of memory cell drivers 500w and to one memory cell driver 300 of the second set of memory cell drivers 500sb. A read-out of the memory cells 420 of the memory cell arrangement 500 may be carried out by applying a read-out voltage between the source-line node 422s and the bit-line node 422b of the memory cell 420 and by determining a presence and/or a strength of a resulting current flow there between.

According to various aspects, the memory cell arrangement 500 may include a plurality of memory cells 420, e.g. a plurality of FeFET based memory cells, wherein each memory cell of the plurality of memory cells 420 may be unambiguously addressable via the memory cell drivers 300 of the memory cell arrangement 500. The addressing of the memory cells 420 may be carried out via respectively one memory cell driver 300 of the first set of memory cell drivers 500w (e.g. one of the word-line drivers) and one memory cell driver 300 of the second set of memory cell drivers 500sb (e.g. one of the source/bit-line drivers).

According to various aspects, memory cell arrangement 500 may further include one or more voltage supply circuits 100. The one or more voltage supply circuits 100 may be configured to generate the first supply voltage VPPWL and the second supply voltage VNNWL for each memory cell driver 300 of the first set of memory cell drivers 500w. The one or more voltage supply circuits 100 may be further configured to generate the first supply voltage VPPBL and the second supply voltage VNNBL for each memory cell driver 300 of the second set of memory cell drivers 500sb. According to various aspects, only one voltage supply circuit 100 may be used to generate four output voltages $V_{out}(1, 2, 3, 4)$, wherein one of the generated four output voltages $V_{out}(1, 2, 3, 4)$ may be the first supply voltage VPPWL supplied to each memory cell driver 300 of the first set of memory cell drivers 500w, another one of the generated four output voltages $V_{out}(1, 2, 3, 4)$ may be the second supply voltage VNNWL supplied to each memory cell driver 300 of the first set of memory cell drivers 500w, another one of the generated four output voltages $V_{out}(1, 2, 3, 4)$ may be the first supply voltage VPPBL supplied to each memory cell driver 300 of the second set of memory cell drivers 500sb, and still another one of the generated four output voltages $V_{out}(1, 2, 3, 4)$ may be the second supply voltage VNNBL supplied to each memory cell driver 300 of the second set of memory cell drivers 500sb. This may allow to avoid failures during a programming and/or an erase of the memory cells 420, e.g. during a ramping of the supply voltages since the four output voltages $V_{out}(1, 2, 3, 4)$ provided by the voltage supply circuit 100 have a predefined relationship to one another.

The first supply voltage VPPWL and the second supply voltage VNNWL supplied to each memory cell driver 300 of the first set of memory cell drivers 500w may be generated with an offset relative to the first supply voltage VPPBL and the second supply voltage VNNBL supplied to each memory cell driver 300 of the second set of memory cell drivers 500sb. As an example, the offset may be about ⅓ of the programming voltage VPP. According to various aspects, the supply voltages VPPWL, VNNWL, VPPBL, VNNBL may be provided to the respective memory cell drivers 300 of the memory cell arrangement 500 during writing the respective memory cells 420, e.g. during a programming operation and/or during an erase operation. Another voltage regime may be used (e.g. including a read-out voltage VDDread applied between the respective source-line SL and bit-line BL) for a readout of the memory cell. A readout of a FeFET based memory cell may be carried out by applying a readout voltage VDDread between the source and the drain of a FeFET based memory cell and measuring a resulting electrical current flow.

According to various aspects, a memory cell 420 may have (e.g. may define) a programming voltage VPP associated therewith for programming and/or erasing the memory cell 420. As exemplarily illustrated in FIG. 5B, the first supply voltage VPPWL and the second supply voltage VNNWL may be generated for each memory cell driver 300 of the first set of memory cell drivers 500w so that (e.g. during programming and/or erasing) a voltage difference between the first supply voltage VPPWL and the second supply voltage VNNWL is in the range from about 60% to about 72% of the programming voltage VPP. As an example, the voltage difference between the first supply voltage VPPWL and the second supply voltage VNNWL may be about ⅔ of the programming voltage VPP. Further, the first supply voltage VPPBL and the second supply voltage VNNBL may be generated for each memory cell driver 300 of the second set of memory cell drivers 500sb so that (e.g. during programming and/or erasing) a voltage difference between the first supply voltage VPPBL and the second supply voltage VNNBL is in the range from about 60% to about 72% of the programming voltage VPP. As an example, the voltage difference between the first supply voltage VPPBL and the second supply voltage VNNBL may be about ⅔ of the programming voltage VPP.

According to various aspects, the timing diagram 500t in FIG. 5B shows a first voltage ramping scheme 500p-1 (e.g. a ramping for a first write operation, e.g. for a programming operation) and a second voltage ramping scheme 500p-2 (e.g. a ramping for a second write operation, e.g. an erase operation) of the supply voltages VPPWL, VNNWL, VPPBL, VNNBL. The first voltage ramping scheme 500p-1 may provide the programming voltage VPP to the respective memory cells 420 to be written (e.g. to be programmed or erased). The second voltage ramping scheme 500p-2 may provide the inverse programming voltage −VPP to the respective memory cells 420 to be written (e.g. to be erased or programmed). Via selecting the addressing voltages $V_{add}$(j,k) it may be defined, which memory cell 420 of the memory cell arrangement 500 is actually programmed and/or erased, as shown in more detail in FIG. 5C and FIG. 5D. Illustratively, four voltage levels (also referred to as predefined voltage values or predefined output voltage levels) may be used for programming and or erasing the memory cells 420.

According to various aspects, the voltage supply circuit 100 as described herein may be used to generate the supply voltages. Illustratively, the output voltages of the voltage supply circuit 100 may be used as the supply voltages to operate the memory cell arrangement 400, 500. According to various aspects, the voltage supply circuit 100 may be configured to ramp a set of output voltages to a corresponding set of predefined output voltage levels, also referred to as set of predefined voltage values. To implement a VPP/3 programming scheme for a memory cell arrangement, the set of predefined output voltage levels may include at least four different predefined output voltage levels, a lowest predefined output voltage level, a second lowest predefined output voltage level, a second highest predefined output voltage level, and a highest predefined output voltage level. In other words, after the ramping is finished for all output voltages, the set of output voltages may include four different output voltages ramped to the four different predefined output voltage levels, a lowest output voltage is ramped to the lowest predefined output voltage level, a second lowest output voltage is ramped to the second lowest predefined output voltage level, a second highest output voltage is ramped to the second highest predefined output voltage level, and a highest output voltage is ramped to the highest predefined output voltage level (see FIG. 13B and FIG. 13C, for example).

In the first voltage ramping scheme 500p-1, VNNBL may be ramped to the lowest predefined output voltage level, VNNWL may be ramped to the second lowest predefined output voltage level, VPPBL may be ramped to the second highest predefined output voltage level, and VPPWL may be ramped to the highest predefined output voltage level. In second voltage ramping scheme 500p-2, VNNWL may be ramped to the lowest predefined output voltage level, VNNBL may be ramped to the second lowest predefined output voltage level, VPPWL may be ramped to the second highest predefined output voltage level, and VPPBL may be ramped to the highest predefined output voltage level.

According to various aspects, a constant reference voltage (e.g. a ground voltage or any other suitable base voltage) may be used as one of the supply voltages for programming and/or erasing the memory cells. In this case, this constant reference voltage may not be ramped. However, in this case, the voltage supply circuit 100 may be configured to generate the output voltages based on the constant reference voltage (see FIG. 13A, for example).

According to various aspects, the memory cell arrangement 500 may further include one or more addressing circuits 540 configured to provide the plurality of addressing voltages $V_{add}$(j,k) for each memory cell driver 300 of the first set of memory cell drivers 500w and of the second set of memory cell drivers 500sb. The one or more addressing circuits 540 may be configured to provide the plurality of addressing voltages $V_{add}$(j,k) for each memory cell driver 300 of the first set of memory cell drivers 500w and each memory cell driver 300 of the second set of memory cell drivers 500sb to perform a programming operation and/or an erase operation for one or more memory cells 420 of the memory cell arrangement 500.

According to various aspects, before the supply voltages are ramped by the one or more voltage supply circuits 100 for one or more write operations, the respective addressing voltages $V_{add}$(j,k) may be applied to the memory cell drivers 300 of the memory cell arrangement 500. This may reduce stress subjected to the transistors of the logic circuits 301 of the memory cell drivers 300 during the write operation.

Figure 5C:
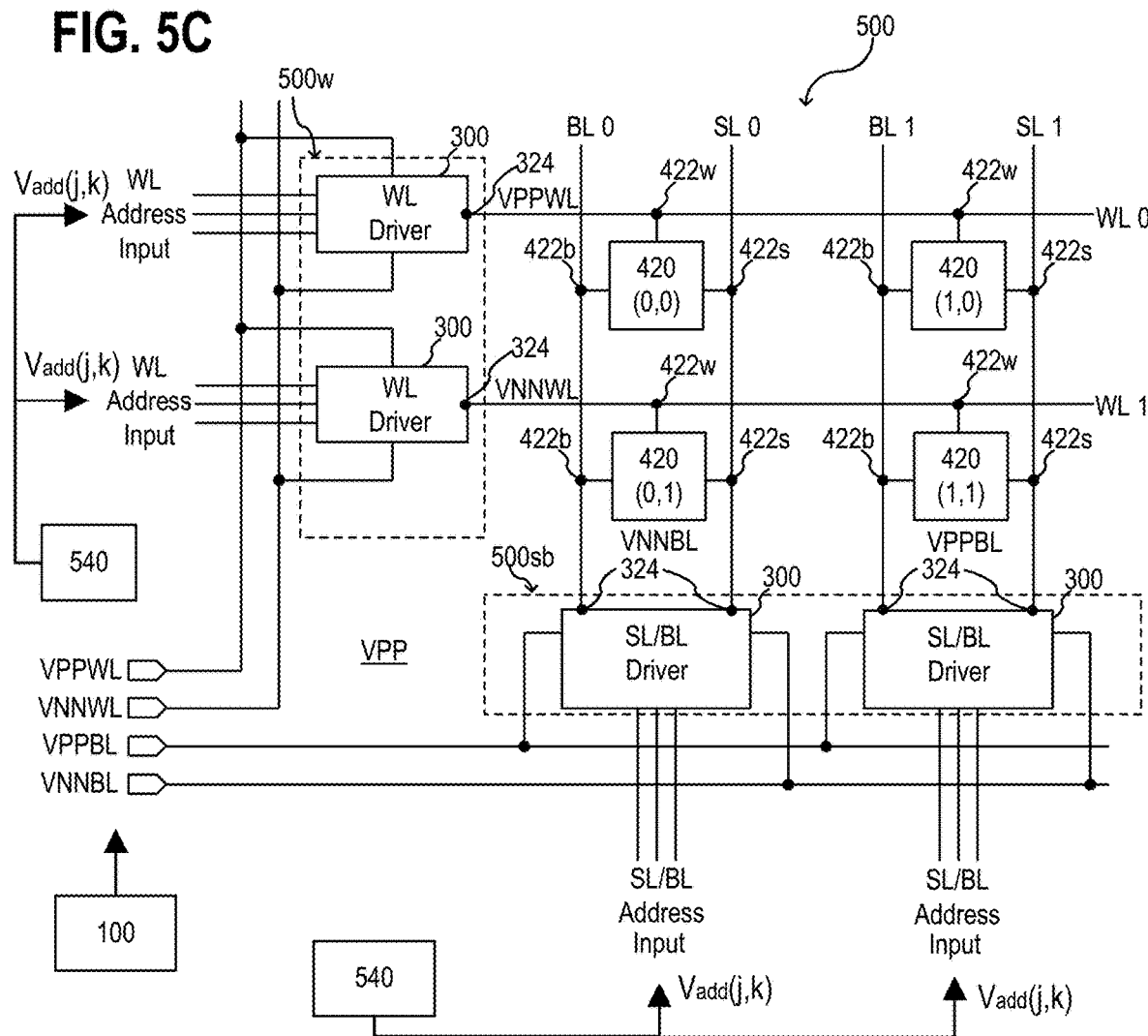
FIG. 5C and FIG. 5D show a memory cell arrangement during a write operation with various supply voltages supplied to the memory cells of the memory cell arrangement via memory cell drivers, according to various aspects.

FIG. 5C shows the memory cell arrangement 500 and the corresponding supply voltages and output voltages provided during a first write operation (e.g. during a programming operation). Via the addressing voltages $V_{add}$(j,k) it may be selected whether VPPWL or VNNWL is output to the respective word-lines WL0, WL1 and whether VPPBL or VNNBL is output to the respective source/bit-lines BL0/SL0, BL1, SL1. During the first write operation, see for example FIG. 5B, VPPWL is ramped to $V_{ref}+\frac{2}{3}$ VPP, VNNWL is ramped to $V_{ref}$, VPPBL is ramped to $V_{ref}+\frac{1}{3}$ VPP, VNNBL is ramped to $V_{ref}-\frac{1}{3}$ VPP. $V_{ref}$ may be a reference voltage (also referred to as reference potential) for the programming operation. In the case that VPPWL is applied to a word-line (e.g. WL0) via the corresponding word-line driver 300 and VNNBL is applied to a source-line (e.g. SL0) and a bit-line (e.g. BL0) via the corresponding source/bit-line driver, a memory cell 420 (e.g. the memory cell (0,0)) that may receive VPPWL, VNNBL may receive, as a result of the voltage difference between VPPWL and VNNBL, the programming voltage VPP (e.g. with positive polarity) and therefore this memory cell may be programmed or erased. To avoid a programming or an erase of all other memory cells 420 (e.g. of the memory cells (1,0), (0,1), and (1,1)), VNNWL is applied to all other word-lines (e.g. WL1) via the corresponding word-line drivers 100 and VPPBL is applied to all other source-lines (e.g. SL1), and all other bit-lines (e.g. BL1) via the corresponding source/bit-line drivers. As a result, all memory cells 420 may receive only one-third of the full programming voltage VPP. As an example, a memory cell 420 (e.g. the memory cell (0,1)) that may receive VNNWL, VNNBL may receive, as a result of the voltage difference between VNNWL and VNNBL, one-third of the programming voltage VPP and therefore this memory cell is not written (e.g. not programmed or not erased). As an example, a memory cell 420 (e.g. the memory cell (1,0)) that may receive VPPWL, VPPBL may receive, as a result of the voltage difference between VPPWL and VPPBL, one-third of the programming voltage VPP and therefore this memory cell is not written (e.g. not programmed or not erased). As an example, a memory cell 420 (e.g. the memory cell (1,1)) that may receive VNNWL, VPPBL may receive, as a result of the voltage difference between VNNWL and VPPBL, one-third of the programming voltage VPP and therefore this memory cell is not written (e.g. not programmed or not erased).

Figure 5D:
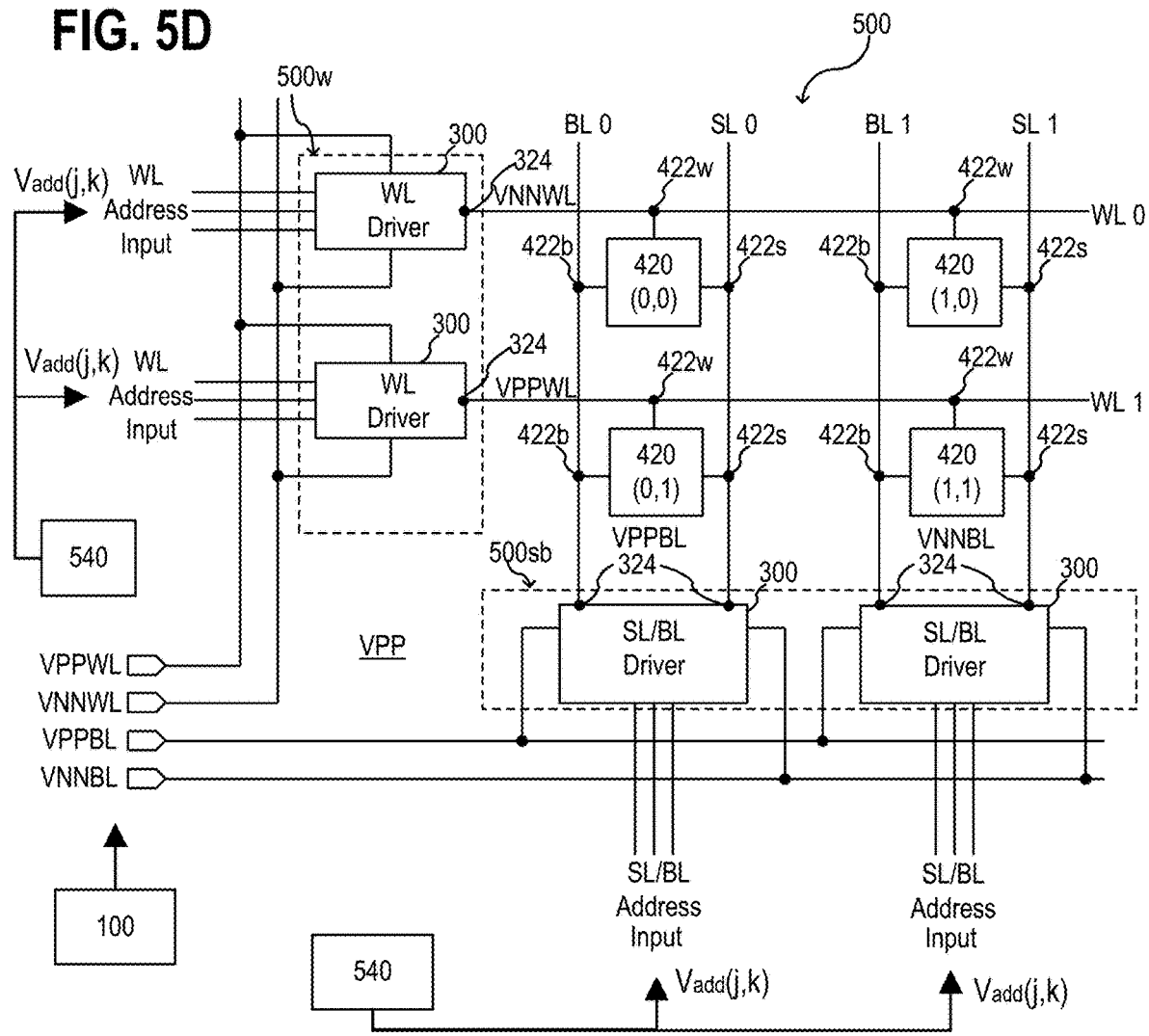

FIG. 5D shows the memory cell arrangement 500 and the corresponding supply voltages and output voltages provided during a second write operation (e.g. during an erase operation). Via the addressing voltages $V_{add}(j,k)$ it may be selected whether VPPWL or VNNWL is output to the respective word-lines WL0, WL1 and whether VPPBL or VNNBL is output to the respective source/bit-lines BL0/SL0, BL1, SL1. During the second write operation, see for example FIG. 5B, VPPWL is ramped to $V_{ref}+\frac{1}{3}$ VPP, VNNWL is ramped to $V_{ref}-\frac{1}{3}$ VPP, VPPBL is ramped to $V_{ref}+\frac{2}{3}$ VPP, and VNNBL is ramped to $V_{ref}$. $V_{ref}$ may be a reference voltage for the erase operation, e.g. the reference voltage for the erase operation may be equal to the reference voltage for the programming operation. In the case that VNNWL is applied to a word-line (e.g. WL0) via the corresponding word-line driver 300 and VPPBL is applied to a source-line (e.g. SL0) and a bit-line (e.g. BL0) via the corresponding source/bit-line driver, a memory cell 420 (e.g. the memory cell (0,0)) that may receive VNNWL, VPPBL may receive, as a result of the voltage difference between VNNWL and VPPBL, the full programming voltage VPP (e.g. with negative polarity) and therefore this memory cell may be written (e.g. programmed or erased). To avoid a programming and/or an erase of all other memory cells 420 (e.g. of the memory cells (1,0), (0,1), and (1,1)), VPPWL is applied to all other word-lines (e.g. WL1) via the corresponding word-line drivers 100 and VNNBL is applied to all other source-lines (e.g. SL1), and all other bit-lines (e.g. BL1) via the corresponding source/bit-line drivers. As a result, all memory cells 420 may receive only one-third of the full programming voltage VPP. As an example, a memory cell 420 (e.g. the memory cell (0,1)) that may receive VPPWL, VPPBL may receive, as a result of the voltage difference between VPPWL and VPPBL, one-third of the programming voltage VPP and therefore this memory cell is not written (e.g. not programmed or not erased). As an example, a memory cell 420 (e.g. the memory cell (1,0)) that may receive VNNWL, VNNBL may receive, as a result of the voltage difference between VNNWL and VNNBL, one-third of the programming voltage VPP and therefore this memory cell is not written (e.g. not programmed or not erased). As an example, a memory cell 420 (e.g. the memory cell (1,1)) that may receive VPPWL, VNNBL may receive, as a result of the voltage difference between VPPWL and VNNBL, one-third of the programming voltage VPP and therefore this memory cell is not written (e.g. not programmed or not erased).

FIG. 6 shows a schematic flow diagram of a method 600 for operating a memory cell (e.g. a memory cell 420 of the memory cell arrangement 400, 500 as described with reference to FIGS. 4A, 4B, and 5A to 5D), according to various aspects. The method 600 may include: in 610, providing, via a voltage supply circuit 100, a first supply voltage (e.g. VPPWL or VPPBL) to a first supply node (e.g. the first supply node 302) and a second supply voltage (e.g. VNNWL or VNNBL) to a second supply node (e.g. the second supply node 312) of a logic circuit (e.g. of the logic circuit 301 as described with reference to FIG. 3); and, in 620, providing a set of addressing voltages (e.g. $V_{add}(j,k)$) to a set of addressing nodes (e.g. the plurality of addressing nodes 314) of the logic circuit, wherein the logic circuit is configured to output a driving voltage (e.g. driving voltage 324v) at a driving node (e.g. driving node 324) of the logic circuit to drive the memory cell, wherein the driving voltage may be substantially equal to either the first supply voltage or the second supply voltage as a function of the provided set of addressing voltages. Illustratively, the set of addressing voltages is provided to select, via the logic circuit, one of the two supply voltages as a current driving voltage that is output to the memory cell. The driving node may be directly coupled (e.g. electrically conductively connected) to a single control node (e.g. the word-line node 422w) or to two control nodes (e.g. the source-line node 422s and the bit-line node 422b) of the memory cell. According to various aspects, the memory cell may have a programming voltage (VPP) that allows for a programming and/or an erase of the memory cell. The writing of the memory cell may include changing the memory state of the memory cell, also referred to as programming and/or erasing. According to various aspects, during writing the memory cell, the voltage difference between the first supply voltage and the second supply voltage supplied to a memory cell driver 300 may be in the range from about 60% to about 72% of the programming voltage. In particular, during writing the memory cell, the voltage difference between the first supply voltage and the second supply voltage supplied to a memory cell driver 300 may be about ⅔ of the programming voltage.

Figure 7A:
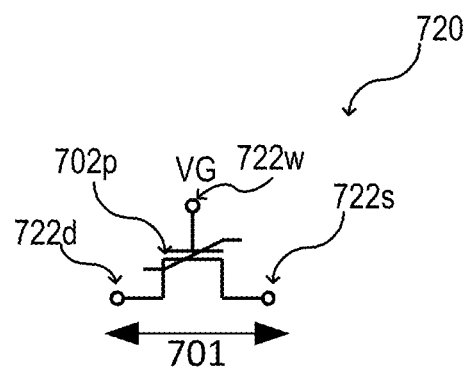
FIG. 7A shows a ferroelectric field-effect transistor that may be used as a memory cell, according to various aspects.

FIG. 7A illustrates a remanent-polarizable memory cell 720 in a schematic view, according to various aspects. The remanent-polarizable memory cell 720 may include at least one remanent-polarizable layer 702p, e.g. including or consisting of a remanent-polarizable material. The remanent-polarizable material may be, for example, ferroelectric hafnium oxide. According to various aspects, the remanent-polarizable memory cell 720 may include a first control node 722w (e.g. a word-line node), a second control node 722s (e.g. a source-line node), and a third control node 722d (e.g.

a bit-line node). The remanent-polarizable memory cell 720 may be configured such that an electrical behavior of the second control node 722s and the third control node 722d may be controlled via the first control node 722w. The electrical behavior of the second control node 722s and the third control node 722d may include, for example, an electrical resistance associated with an electrical current flow 701 between the second control node 722s and the third control node 722d. The electrical current flow 701 between the second control node 722s and the third control node 722d may be controlled by controlling a voltage VG (e.g. a gate voltage) that is applied at the first control node 722w. In other words, the electrical current flow 701 between the second control node 722s and the third control node 722d may be varied by varying a gate voltage VG that is applied at the first control node 722w.

The remanent-polarizable memory cell 720 may be a ferroelectric field-effect transistor (FeFET), wherein the second control node 722s may be a first source/drain terminal, the third control node 722d may be a second source/drain terminal, and the first control node 722w may be a gate terminal. In this case, the electrical current flow 701 between the first source/drain terminal and the second source/drain terminal may be controlled by controlling a gate voltage VG that is applied at the gate terminal.

Figure 7B:
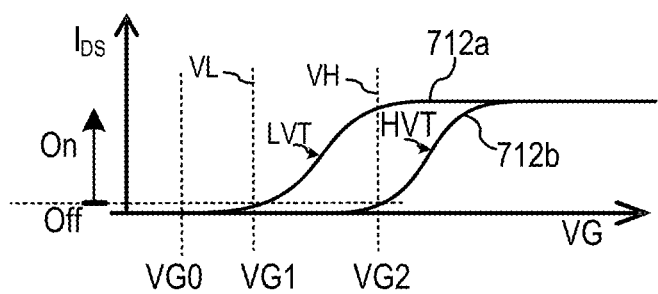
FIG. 7B shows a current/voltage characteristic of a ferroelectric field-effect transistor, according to various aspects.

FIG. 7B illustrates a schematic current/voltage (I/V) diagram representing an electrical behavior of a remanent-polarizable memory cell 720, according to various aspects. The remanent-polarizable memory cell 720 may be or may include a ferroelectric field-effect transistor. As an example, the remanent-polarizable memory cell 720 may include a first memory state 712a, e.g. a low threshold voltage state (LVT), and a second memory state 712b, e.g. a high threshold voltage state (HVT). The remanent-polarizable memory cell 720 may be switched between the first memory state 712a and the second memory state 712b by changing the remanent-polarization of the at least one remanent-polarizable layer 702p included in the remanent-polarizable memory cell 720.

For each memory state 712a, 712b, the electrical current flow (see vertical axis IDs) between the second control node 722s and the third control node 722d may be controlled by controlling a control voltage (see horizontal axis VG) that is applied at the first control node 722w. For a FeFET, the control voltage may be referred to as gate voltage, as example. The remanent-polarizable memory cell 720 may have a first threshold voltage VL in the first memory state 712a and a second threshold voltage VH in the second memory state 712b. The first threshold voltage VL may be less than the second threshold voltage VH. According to various aspects, changing the remanent-polarization of the at least one remanent-polarizable layer 702p may include applying a voltage between the source/drain terminals and the gate terminal that is substantially equal to or greater than the programming voltage. The programming voltage may be selected so that a predefined remanent polarization of the at least one remanent-polarizable layer 702p is caused upon application of the programming voltage.

According to various aspects, erasing a memory cell may be understood as storing a logic "0" in the memory cell and programming a memory cell may be understood as storing a logic "1" in the memory cell. Erasing a memory cell may be also referred to as writing a logic "0" into the memory cell. Programming a memory cell may be also referred to as writing a logic "1" into the memory cell. The programming voltage for storing a logic "0" (also referred to erasing) in the memory cell may have the opposite polarity compared to the programming voltage for storing a logic "1" (also referred to programming) in the memory cell. The logic "1" may be assigned to the first memory state 712a and the logic "0" may be assigned to the second memory state 712b. However, the definition of the states, the logic bit values and/or the terms programming and erasing may be selected arbitrarily.

As an example, in the first memory state 712a, the remanent-polarizable memory cell 720 may be configured to be electrically conductive (also referred to as "on", i.e. allowing a substantial current flow 701 between the second control node 722s and the third control node 722d) in the case that a second (e.g. predefined) gate voltage VG1 is applied to the first control node 722w as well as in the case that a third (e.g. predefined) gate voltage VG2 is applied to the first control node 722w. Further, in the first memory state 712a, the remanent-polarizable memory cell 720 may be configured to be electrically isolating (also referred to as non-conductive or "off", i.e. preventing a substantial current flow 701 between the second control node 722s and the third control node 722d) in the case that a first (e.g. predefined) gate voltage VG0 is applied to the first control node 722w. As illustrated in FIG. 7B, the third gate voltage VG2 may be greater than the second gate voltage VG1, and the second gate voltage VG1 may be greater than the first gate voltage VG0.

Further, in the second memory state 712b, the remanent-polarizable memory cell 720 may be configured to be electrically conductive (also referred to as "on", i.e. allowing a substantial current flow 701 between the second control node 722s and the third control node 722d) in the case that the third gate voltage VG2 is applied to the first control node 722w. Further, in the second memory state 712b, the remanent-polarizable memory cell 720 may be configured to be electrically isolating (also referred to as non-conductive or "off", i.e. preventing a substantial current flow 701 between the second control node 722s and the third control node 722d) in the case that the first gate voltage VG0 is applied to the first control node 722w as well as in the case that the second gate voltage VG1 is applied to the first control node 722w. Illustratively, the remanent-polarizable memory cell 520 may be switched "on" and "off" at predefined control voltages depending on the respective memory state 712a, 712b (LVT, HVT) of the remanent-polarizable memory cell 720. According to various aspects, a FeFET may be used as remanent-polarizable memory cell 720, wherein a current flow between the source/drain terminals may be substantially zero in the case that the FeFET is "off", e.g. in the case that a control voltage equal to or less than the first threshold voltage VL is applied at the gate terminal of the FeFET in the first memory state 712a and in the case that a control voltage equal to or less than the second threshold voltage VH is applied at the gate terminal of the FeFET in the second memory state 712b. Illustratively, a predefined gate voltage VG0, VG1, VG2 is associated with a threshold voltage VL, VH of the remanent-polarizable memory cell 720 (e.g. of a FeFET) in the respective memory state 712a, 712b.

Figure 8A:
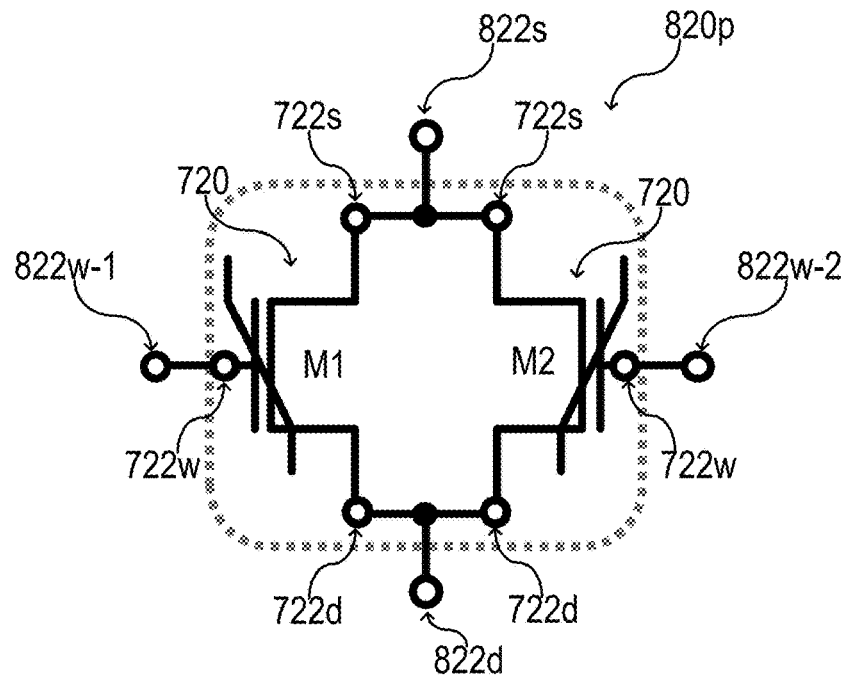
FIG. 8A and FIG. 8B show a ferroelectric field-effect transistor based ternary memory cell, according to various aspects.

FIG. 8A shows a ternary memory cell 820p in a schematic view, according to various aspects. Illustratively the ternary memory cell 820p may include or consist of two remanent-polarizable memory cells 720 (e.g. two FeFETs) coupled in parallel with one another. According to various aspects, the ternary memory cell 820p may include a first remanent-polarizable memory cell M1 and a second remanent-polarizable memory cell M2. Both remanent-polarizable memory cells M1, M2 may be configured as described herein in FIGS. 7A and 7B with reference to the remanent-polarizable memory cell 720. In other words, the remanent-polarizable memory cell M1 may include a first control node 722w, a second control node 722s, and a third control node 722d to control an electrical behavior of the second control node 722s and the third control node 722d of the first remanent-polarizable memory cell M1. Further, the second remanent-polarizable memory cell M2 may include a first control node 722w, a second control node 722s, and a third control node 722d to control an electrical behavior of the second control node 722s and the third control node 722d of the second remanent-polarizable memory cell M2.

According to various aspects, the ternary memory cell 820p may include a first control node 822w-1 (e.g. a first lookup-line node) to connect the ternary memory cell 820p to a first control-line (e.g. to a first lookup-line). Further, the ternary memory cell 820p may include a second control node 822w-2 (e.g. a second lookup node) to connect the ternary memory cell 820p to a second control-line (e.g. to a second lookup-line). In a ternary memory cell arrangement, the respective control nodes 822w-1, 822w-2 of a plurality of ternary memory cells 820p may be connected with one another via a corresponding lookup-line pair; this connected plurality of ternary memory cells 820p may form a first subset of ternary memory cells 820p within the memory cell arrangement. The memory cell arrangement may include a plurality of these first subsets. Each of the first subsets may be used to store a word within the memory cell arrangement. The length of the words may correspond to the number of ternary memory cells 820p in the respective first subset.

The ternary memory cell 820p may include a third control node 822s (e.g. a first match-line node) and a fourth control node 822d (e.g. a second match-line node, also referred to as discharge node) to connect the ternary memory cell 820p to a third control-line (e.g. a first match-line) and a fourth control-line (e.g. a second match-line, or a discharge-line) respectively. In a ternary memory cell arrangement, the respective control nodes 822s, 822d of a plurality of ternary memory cells 820p may be connected with one another via a corresponding pair of match-lines; this connected plurality of ternary memory cells 820p may form a second subset of ternary memory cells 820p within the memory cell arrangement. The memory cell arrangement may include a plurality of these second subsets. Each ternary memory cell 820p of the memory cell arrangement may be part of one specific first subset and one specific second subset. Illustratively, the ternary memory cells 820p of a memory cell arrangement may be arranged in any array that allows the desired addressing of the ternary memory cells 820p.

According to various aspects, the second control node 722s of the first remanent-polarizable memory cell M1 and the second control node 722s of the second remanent-polarizable memory cell M2 may be electrically connected to the first match line node 822s. According to various aspects, the third control node 722d of the first remanent-polarizable memory cell M1 and the third control node 722d of the second remanent-polarizable memory cell M2 may be electrically connected to the second match line node 822d.

Figure 8B:
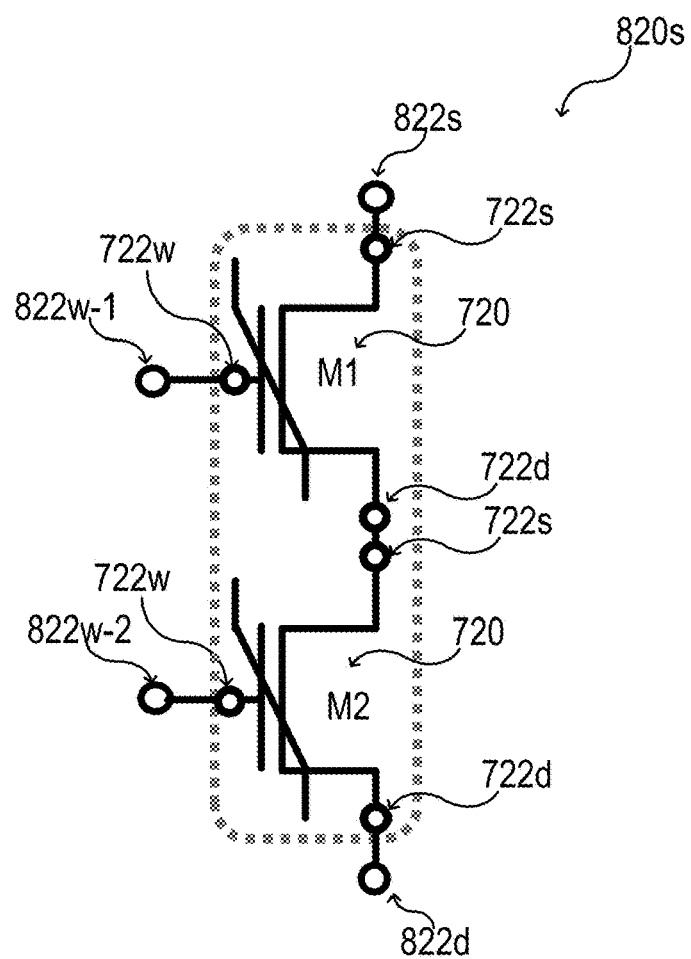

As another example, two remanent-polarizable memory cells 720 (e.g. two FeFETs) may be used in series (e.g. in a NAND configuration) to provide a ternary memory cell 820s, as illustrated in FIG. 8B. The series connection of the two remanent-polarizable memory cells 720 may allow discharging a first match line to a second match line only if both of the two remanent-polarizable memory cells 720 are conducting. The discharge of the first match line may be associated with a mismatch. A match may be detected only if none or only one of the remanent-polarizable memory cells 720 is conducting, or in other words, if the first match line remains pre-charged. However, the NOR configuration, e.g. as described above, allows to use low lookup voltages to, for example, avoid a read disturb. Illustratively, lookup voltages less than the second threshold voltage VH may be used in the NOR configuration.

According to various aspects, the ternary memory cell 820p, 820s may be addressed via the four nodes 822w-1, 822w-2, 822s, 822d. In a memory cell arrangement, a plurality of ternary memory cells 820p, 820s may be individually addressable via their respective nodes 822w-1, 822w-2, 822s, 822d. Each of the four nodes 822w-1, 822w-2, 822s, 822d may be connected to a driving node 324 of a memory cell driver 300. As an example, four memory cell drivers 300 may be used to program the ternary memory cells 820p, 820s of a ternary memory cell arrangement.

Figure 9A:
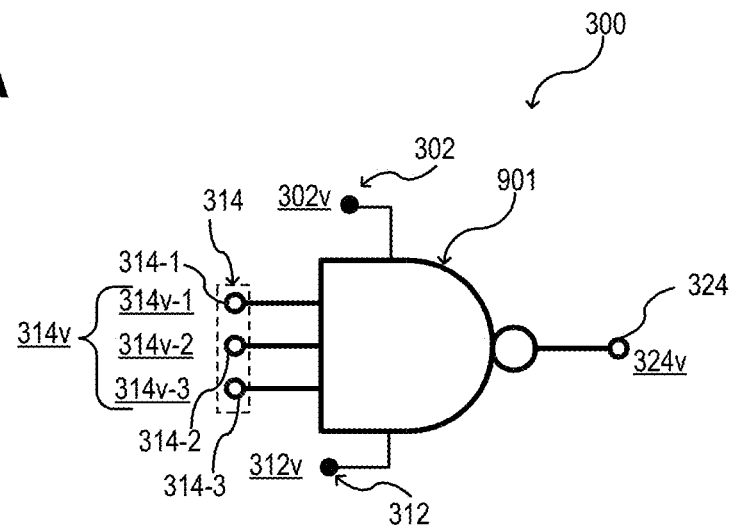
FIGS. 9A to 9D show a memory cell driver including a NAND logic circuit, according to various aspects.
Figure 9B:
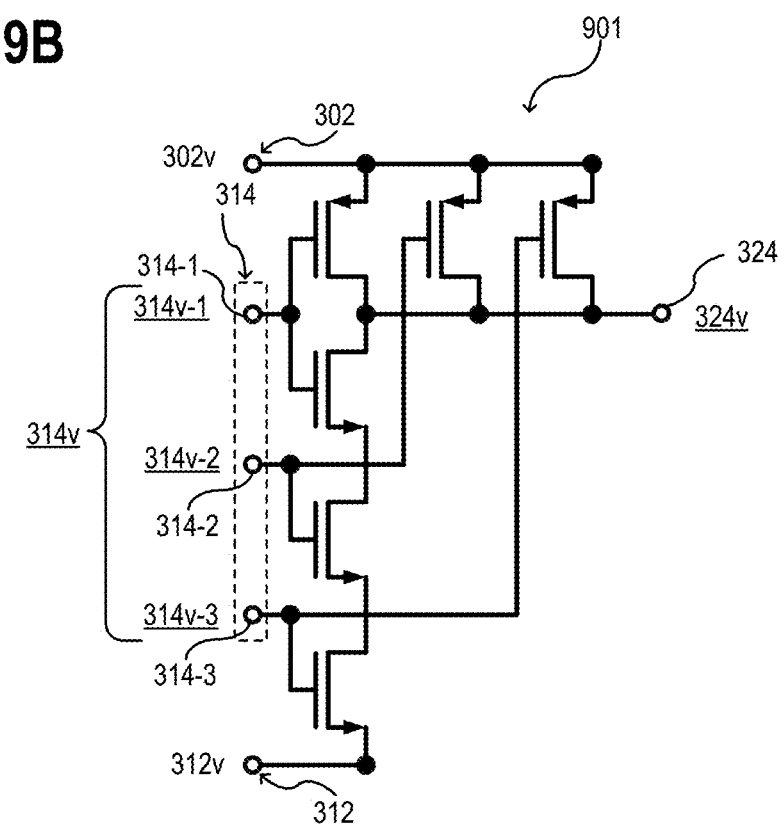

FIG. 9A shows a memory cell driver 300 based on a multi-input NAND logic circuit 901 in a schematic view, according to various aspects. FIG. 9B shows a circuit diagram of the multi-input NAND logic circuit 901, as an example. According to various aspects, the logic circuit 301 of the memory cell driver 300 illustrated, for example, in FIG. 3 may include a multi-input NAND logic circuit 901. In some aspects, not more than one multi-input logic circuit may be used to provide the desired functions of the memory cell driver 300 described herein.

According to various aspects, a three-input NAND logic circuit 901 is illustrated in FIGS. 9A and 9B; however, an n-input with n=2, n=3, or n>3 may be used in a similar way. A set of n addressing voltages 314v may be used accordingly. As an example (e.g. for n=3), three addressing voltages 314v-1, 314v-2, 314v-3 may be provided accordingly to the three addressing nodes 314-1, 314-2, 314-3. According to various aspects, the logic circuit 901 of the memory cell driver 300 may be provided in CMOS technology, as illustrated, for example, in FIG. 9B.

Figure 9C:
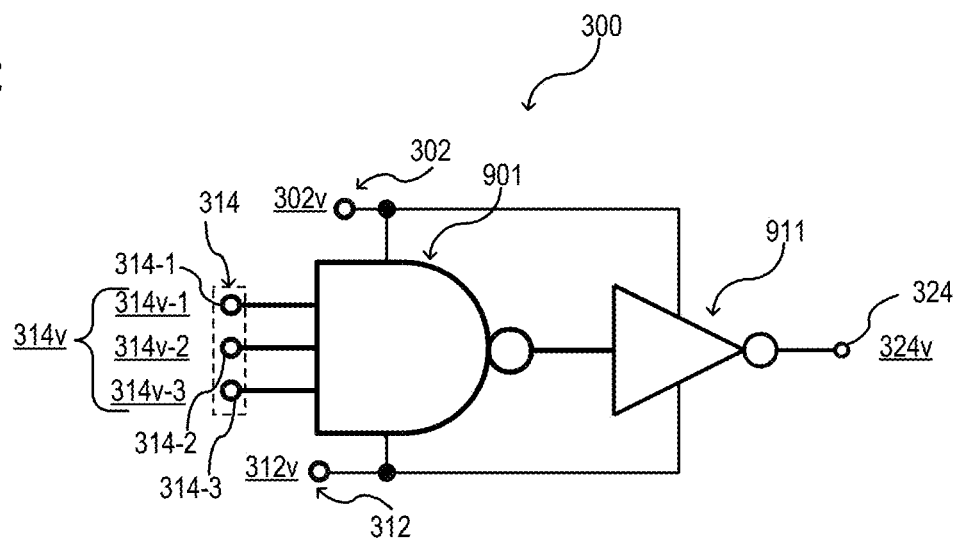
Figure 9D:
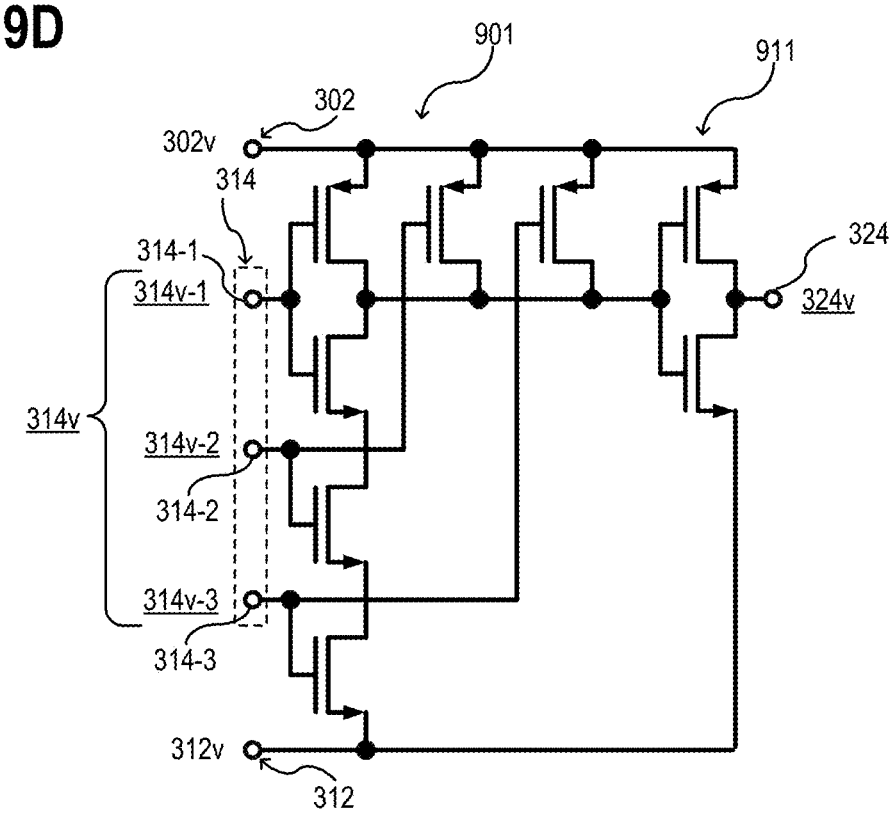

According to various aspects, the output of the multi-input NAND logic circuit 901 may be inverted by an inverter circuit 911, as illustrated in FIG. 9C and FIG. 9D.

According to various aspects, the output of the multi-input NAND logic circuit 901 may be delayed by one or more buffer circuits (not illustrated).

According to various aspects, instead of a multi-input NAND logic circuit 901 a multi-input AND logic circuit may be used in the same or in a similar way. According to various aspects, instead of a multi-input NAND logic circuit 901 a multi-input NOR logic circuit may be used in the same or in a similar way. According to various aspects, instead of a multi-input NAND logic circuit 901 a multi-input OR logic circuit may be used in the same or in a similar way.

Figure 10:
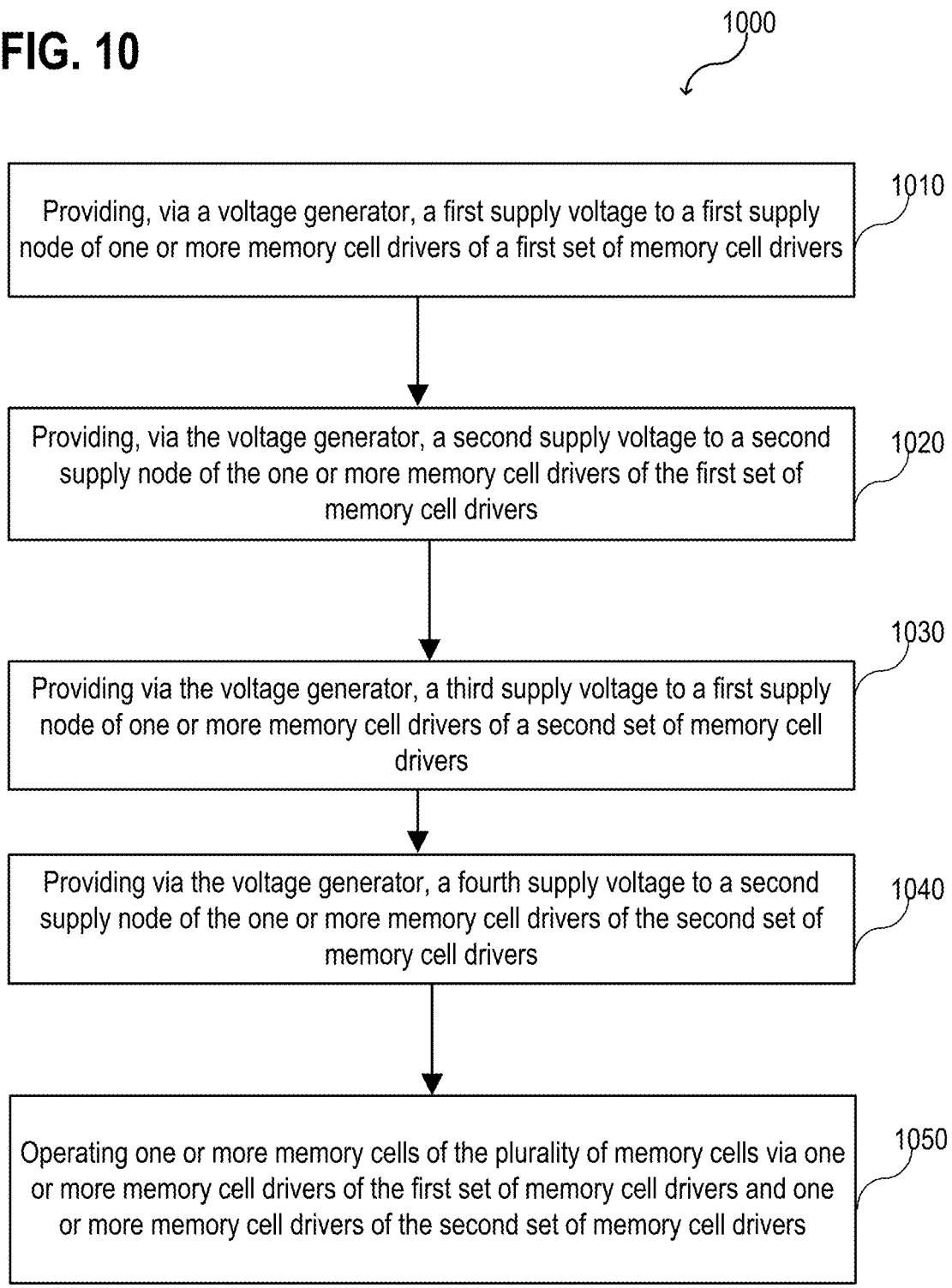
FIG. 10 shows a schematic flow diagram of a method for operating a memory cell arrangement, according to various aspects.

FIG. 10 shows a schematic flow diagram of a method 1000 for operating a memory cell arrangement, according to various aspects. The memory cell arrangement may include a plurality of memory cells, e.g. a plurality of memory cells 420 as described above with reference to the memory cell arrangement 500. According to various aspects, the method 1000 may include: in 1010, providing, via a voltage supply circuit 100, a first supply voltage VPPWL to a first supply node 302 of one or more memory cell drivers 300 of a first set of memory cell drivers 500w; in 1020, providing, via the voltage supply circuit 100, a second supply voltage VNNWL to a second supply node 312 of the one or more memory cell drivers 300 of the first set of memory cell drivers 500w; in 1030, providing, via the voltage supply circuit 100, a third supply voltage VPPBL to a first supply node 302 of one or more memory cell drivers 300 of a second set of memory cell drivers 500sb; in 1040, providing, via the voltage supply circuit 100, a fourth supply voltage VNNBL to a second supply node 312 of the one or more memory cell drivers 300 of the second set of memory cell drivers 500sb; and, in 1050, operating one or more memory cells of the plurality of memory cells 420 via one or more memory cell drivers 300 of the first set of memory cell drivers 500w and one or more memory cell drivers 300 of the second set of memory cell drivers 500sb. Operating the one or more memory cells may include, for example, providing, for each memory driver 300 of the first set of memory cell drivers 500w, a plurality of addressing voltages to the plurality of addressing nodes 314 to control the memory driver 300 to output either the first supply voltage VPPWL or the second supply voltage VNNWL to the respective one or more first control-lines WL; and/or providing, for each memory driver 300 of the second set of memory cell drivers 500sb, a plurality of addressing voltages to the plurality of addressing nodes 314 to control the memory driver 300 to output either the third supply voltage VPPBL or the fourth supply voltage VNNBL to the respective one or more second control-lines SL, BL, see, for example, FIG. 5C and FIG. 5D.

According to various aspects, a FeFET memory driver circuitry (referred to as memory cell driver 300) is provided. The FeFET memory driver circuitry may be built with logic gates (e.g. based on AND gates and one or more inverter gates). The FeFET memory driver circuitry has a comparatively low circuit complexity. The transistors of the FeFET memory driver circuitry may be dimensioned to handle only ⅔ of the full programming voltage VPP. This saves, for example, area on a chip or wafer comparted to the same circuitry that has to handle the full programming voltage VPP. According to various aspects, two different voltage domains (VPPWL, VNNWL and VPPBL, VNNBL) can be used for the word-line drivers and the source/bit-line drivers. The voltage domains (VPPWL, VNNWL and VPPBL, VNNBL) may be shifted relative to one another by ⅓ of the programming voltage VPP. Various aspects may be related to a remanent-polarizable layer or a remanent-polarizable material, however, the term "remanent-polarizable" may be understood as "spontaneously-polarizable" and vice versa.

FIG. 11 shows a schematic flow diagram of a method 1100 for operating a memory cell arrangement, e.g. for programming and/or erasing one or more memory cells of the memory cell arrangement, according to various aspects. The method 1100 may include, in 1110, providing a set of supply voltages to a set of memory cell drivers to program the one or more memory cells of the memory cell arrangement; wherein providing the set of supply voltages includes: in 1120, ramping a first supply voltage of the set of supply voltages to a first predefined output voltage level, and, in 1130, ramping a second supply voltage of the set of supply voltages to a second predefined output voltage level dependent upon the first supply voltage, the first predefined output voltage level and the second predefined output voltage level defining a first predefined ratio, wherein, during the ramping of the first supply voltage and during the ramping of the second supply voltage, a first ratio of the first supply voltage to the second supply voltage is equal to or less than the first predefined ratio.

The supply voltages may be output voltages $V_{out}(1, \ldots, n)$ generated by the voltage supply circuit 100 described herein. In a similar way, more than two supply voltages (e.g. three or four supply voltages $V_{out}(1, \ldots, n)$) may be ramped via the voltage supply circuit 100.

As an example, providing the set of supply voltages in 1110 may further include: ramping a third supply voltage of the set of supply voltages to a third predefined output voltage level dependent upon the second supply voltage, the second predefined output voltage level and the third predefined output voltage level defining a second predefined ratio, wherein, during the ramping of the second supply voltage and during the ramping of the third supply voltage, a second ratio of the second supply voltage to the third supply voltage is equal to or less than the second predefined ratio. Alternatively, the third supply voltage of the set of supply voltages may be ramped dependent upon the first supply voltage; i.e. providing the set of supply voltages in 1110 may further include ramping a third supply voltage of the set of supply voltages to a third predefined output voltage level dependent upon the first supply voltage, the first predefined output voltage level and the third predefined output voltage level defining a second predefined ratio, wherein, during the ramping of the first supply voltage and during the ramping of the third supply voltage, a second ratio of the first supply voltage to the third supply voltage is equal to or less than the second predefined ratio.

As another example, providing the set of supply voltages may further include: ramping a fourth supply voltage of the set of supply voltages to a fourth predefined output voltage level dependent upon the third supply voltage, the third predefined output voltage level and the fourth predefined output voltage level defining a third predefined ratio, wherein, during the ramping of the third supply voltage and during the ramping of the fourth supply voltage, a third ratio of the third supply voltage to the fourth supply voltage is equal to or less than the third predefined ratio. In a similar way, the fourth supply voltage may be ramped dependent upon the first or second supply voltage.

According to various aspects, providing the set of supply voltages may further include provided a fourth supply voltage of the set of supply voltages, the fourth supply voltage being a constant predefined voltage, wherein the fourth supply voltage has a fourth predefined output voltage level. In this case, the first predefined output voltage level, the second predefined output voltage level, and/or the third predefined output voltage level may be defined by the fourth supply voltage. As an example, the fourth supply voltage may be a base voltage (e.g. a ground voltage or any other suitable reference voltage) for the circuit of the voltage supply circuit 100. According to various aspects, the voltage supply circuit 100 may include various voltage dividers (see FIG. 13A for example), wherein the voltage dividers define the ratios of the respective predefined output voltage levels. The predefined output voltage level may define an upper voltage limit for the corresponding output voltage. The voltage dividers may be connected between an output of the corresponding voltage converter circuit (e.g. a charge pump) and the base voltage $V_{base}$ (e.g. a ground voltage or any other suitable reference voltage).

Figure 12A:
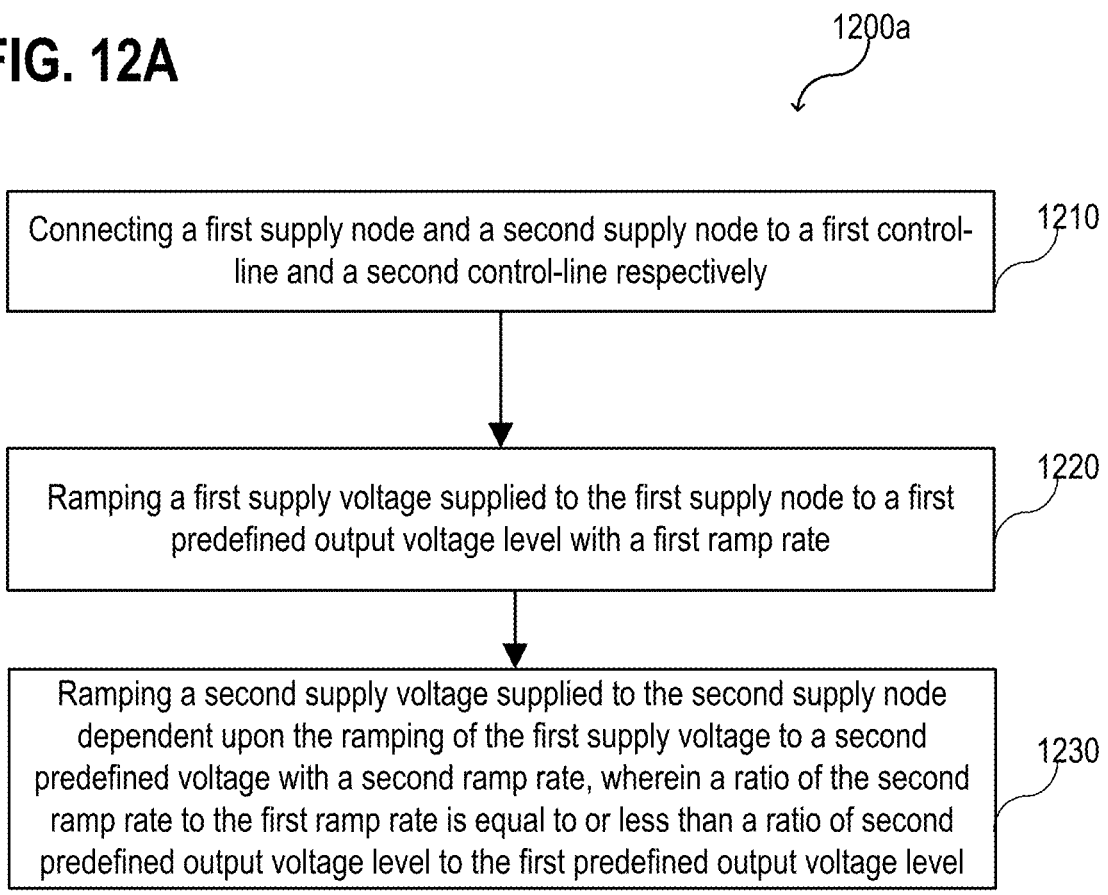
FIG. 12A and FIG. 12B respectively show a schematic flow diagram of a method for operating a memory cell arrangement, according to various aspects.

FIG. 12A shows a schematic flow diagram of a method 1200a for operating a memory cell arrangement, according to various aspects. The method 1200a may include: in 1210, connecting a first supply node and a second supply node to a first control-line and a second control-line respectively; and, subsequently, in 1220, ramping a first supply voltage supplied to the first supply node to a first predefined output voltage level with a first ramp rate; and, in 1230, ramping a second supply voltage supplied to the second supply node dependent upon the ramping of the first supply voltage to a second predefined voltage with a second ramp rate, wherein a ratio of the second ramp rate to the first ramp rate is equal to or less than a ratio of second predefined output voltage level to the first predefined output voltage level. The second supply voltage may be higher than the first supply voltage and the second ramp rate may be greater than the first ramp rate.

Figure 12B:
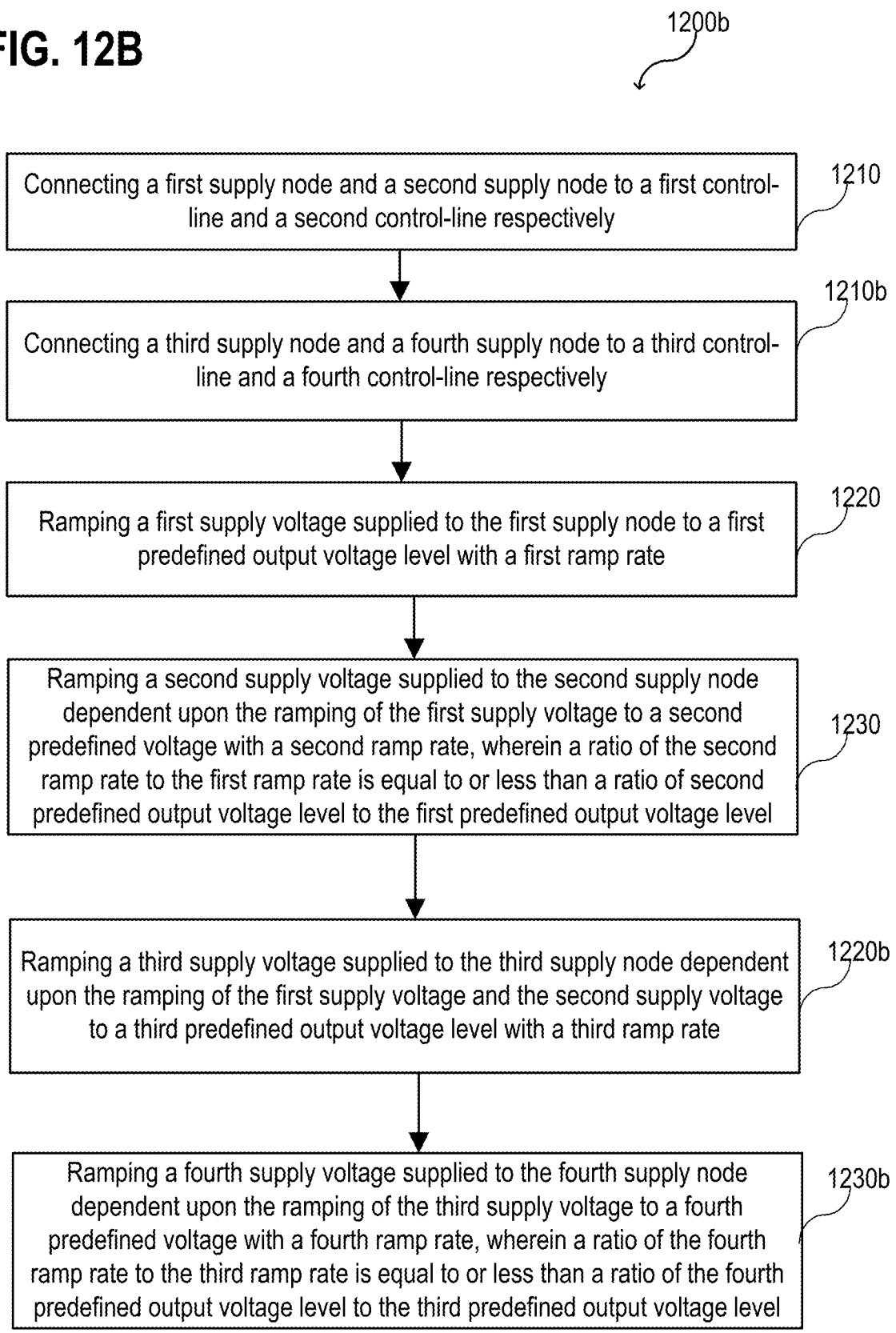

FIG. 12B shows a schematic flow diagram of a method 1200b for operating a memory cell arrangement, according to various aspects. The method 1200b may include: in 1210, connecting a first supply node and a second supply node to a first control-line and a second control-line respectively; in 1210b, connecting a third supply node and a fourth supply node to a third control-line and a fourth control-line respectively; and, subsequently, in 1220, ramping a first supply voltage supplied to the first supply node to a first predefined output voltage level with a first ramp rate; in 1230, ramping a second supply voltage supplied to the second supply node dependent upon the ramping of the first supply voltage to a second predefined voltage with a second ramp rate, wherein a ratio of the second ramp rate to the first ramp rate is equal to or less than a ratio of second predefined output voltage level to the first predefined output voltage level; in 1220b, ramping a third supply voltage supplied to the third supply node dependent upon the ramping of the first supply voltage and the second supply voltage to a third predefined output voltage level with a third ramp rate; and, in 1230b, ramping a fourth supply voltage supplied to the fourth supply node dependent upon the ramping of the third supply voltage to a fourth predefined voltage with a fourth ramp rate, wherein a ratio of the fourth ramp rate to the third ramp rate is equal to or less than a ratio of the fourth predefined output voltage level to the third predefined output voltage level. The second supply voltage may be higher than the first supply voltage and the second ramp rate may be greater than the first ramp rate. The fourth supply voltage may be higher than the third supply voltage and the fourth ramp rate may be greater than the third ramp rate.

According to various aspects, the respective supply node may be coupled to the corresponding control-line via a memory cell driver, e.g. via the memory cell driver described with reference to FIG. 3. Whether the first or second supply node is coupled to the corresponding control-line may be defined by the configuration of the memory cell driver (e.g. by the logic circuit 301) and the addressing of the memory cell driver via the respective addressing voltages (e.g. $V_{add}(j,k)$).

According to various aspects, one or more memory cells 420 of a memory cell arrangement 400, 500 may be programmed and/or erased via the supply voltages provided to the one or more memory cells via the memory cell drivers and the control-lines. In other words, the set of supply voltages VPPWL, VNNWL, VPPBL, VNNBL that are used to program one or more memory cells 420 of the memory cell arrangement 400, 500 may be generated (as output voltages) by a voltage supply circuit 100, as described, for example, with reference to FIGS. 1A to 1C and/or FIGS. 13A to 13C.

Figure 13A:
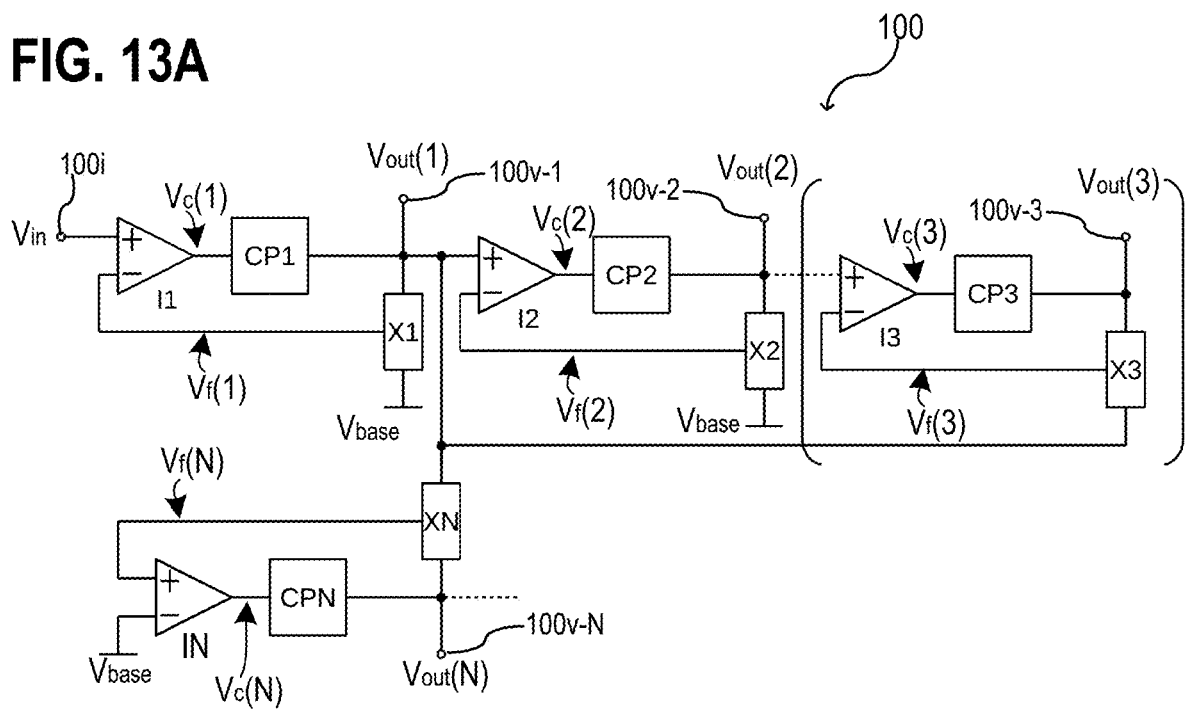
FIG. 13A shows a voltage supply circuit in a schematic view, according to various aspects.
Figure 13B:
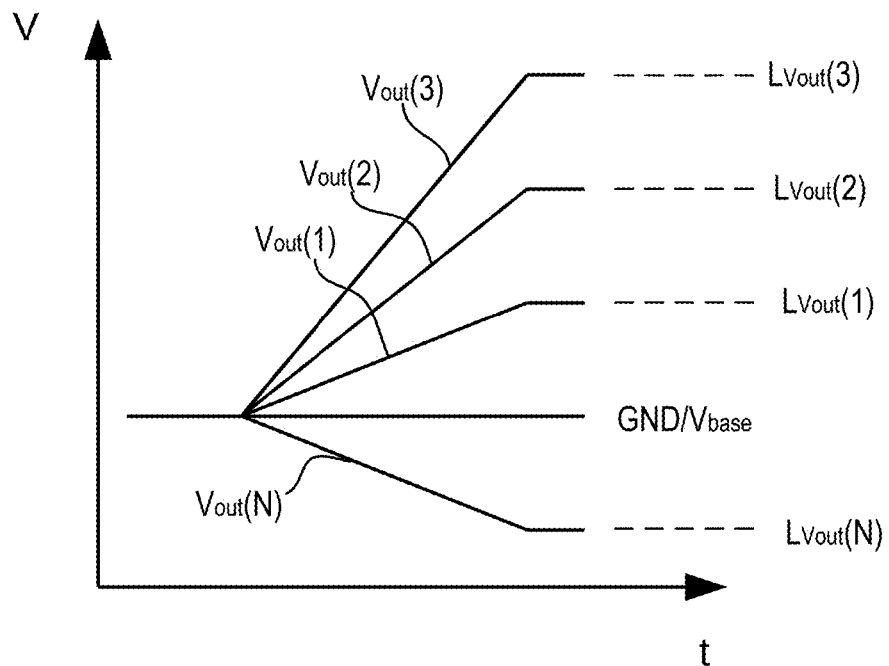
FIG. 13B and FIG. 13C respectively show a ramping of output voltages via a voltage supply circuit, according to various aspects.

According to various aspects, the timing of the ramping of the supply voltages may be substantially the same, as, for example, illustrated in FIG. 13B. As an example, the ramping of the two, three, four, or more supply voltages may start substantially at the same time and end at the same time. Alternatively, the ramping of the two, three, four, or more supply voltages may start substantially at the same time and end at different times, as, for example, illustrated in FIG. 13C. According to various aspects, the higher the respective predefined output voltage level, the higher ramping time. This may ensure that the predefined ratios of the output voltages are not exceeded during the ramping.

In the following, various examples are provided that may include one or more aspects described above with reference to the memory cell driver 300, the memory cell arrangement 400, 500 and methods thereof.

Example 1 is a memory cell driver 300 including: a first supply node 302 to receive a first supply voltage 302v and a second supply node 312 to receive a second supply voltage 312v, a plurality of addressing nodes 314 to receive a plurality of addressing voltages 314v, one or more driving nodes 324, and a logic circuit 301 connected to the first supply node 302, the second supply node 312, the plurality of addressing nodes 314, and the one or more driving nodes 324, wherein the logic circuit 301 includes one or more logic gates and is configured to connect via the one or more logic gates either the first supply node 302 or the second supply node 312 to the one or more driving nodes 324 in response to the plurality of addressing voltages 314v.

In example 2, the memory cell driver 300 of example 1 may optionally include that the logic circuit 301 is configured to provide a driving voltage 324v at each of the one or more driving nodes 324 by connecting the first supply node 302 to the one or more driving nodes 324 so that the driving voltage 324v is substantially the same as the first supply voltage 302v.

In example 3, the memory cell driver 300 of example 1 or 2 may optionally include that the logic circuit 301 is configured to provide a driving voltage 324v at each of the one or more driving nodes 324 by connecting the second supply node 312 to the one or more driving nodes 324 so that the driving voltage 324v is substantially the same as the second supply voltage 312v.

In example 4, the memory cell driver 300 of any one of examples 1 to 3 may optionally include that the one or more logic gates implement a Boolean function.

In example 5, the memory cell driver 300 of example 4 may optionally include that the Boolean function has an arity of two. A Boolean function having an arity of two may be also referred to as a binary Boolean function. The Boolean function may include AND, OR, NAND, NOR, as examples.

In example 6, the memory cell driver 300 of example 4 or 5 may optionally include that each input voltage 314-1, 314-2, 314-3 of the plurality of addressing voltages 314 represents one of at least two input values of the Boolean function. Illustratively, a binary data type is used that may include one of two possible values usually denoted as "true" and "false" or "1" and "0" and that represents the two truth values of logic and Boolean algebra. The Boolean algebra may be implemented as electronic circuit including one or more logic gates. One or more logic gates may implement one or more Boolean functions (also referred to as Boolean operators).

In example 7, the memory cell driver 300 of example 6 may optionally include that the driving voltage 324v provided at the one or more driving nodes 324 represents one of two output values of the Boolean function. The respective output value of the Boolean function may be defined by the plurality of addressing voltages and the Boolean function.

In example 8, the memory cell driver 300 of any one of examples 1 to 7 may optionally include that the one or more logic gates include an n-input logic gate. As an example, n may be an integer number greater than one. Particularly, the one or more logic gates may include no more than one n-input logic gate.

In example 9, the memory cell driver 300 of example 8 may optionally include that the n-input logic gate is one of the following logic gates: an n-input AND gate, an n-input NAND gate, an n-input OR gate, or an n-input NOR gate.

In example 10, the memory cell driver 300 of example 8 or 9 may optionally include that the plurality of addressing nodes 314 are a number of n addressing nodes corresponding to the n-input logic gate.

In example 11, the memory cell driver 300 of any one of examples 1 to 10 may optionally include that the one or more logic gates include one or more single-input logic gates in addition to at least one multi-input logic gate.

In example 12, the memory cell driver 300 of example 11 may optionally include that the one or more single-input logic gates include one or more buffer gates. A buffer gate may be used, for example, to add a delay.

In example 13, the memory cell driver 300 of example 11 or 12 may optionally include that the one or more single-input logic gates include one or more NOT gates. A NOT gate may be also referred to an inverter.

Example 14 is a memory cell arrangement 400, 500, including a memory cell driver 300 of any one of examples 1 to 13. The memory cell arrangement 400, 500 may further include one or more memory cells 420, wherein one or more control nodes of each of the one or more memory cells 420 may be (e.g. electrically conductively) connected to one or more driving nodes 324 of the memory cell driver 300.

Example 15 is a method of operating a memory cell, the method including: providing a first supply voltage to a first supply node of a logic circuit; providing a second supply voltage to a second supply node of the logic circuit; and providing a set of addressing voltages to a set of addressing nodes of the logic circuit, wherein the logic circuit is configured to output a driving voltage at an output node of the logic circuit in response to the provided set of addressing voltages to operate the memory cell, wherein the driving voltage is substantially equal to either the first supply voltage or the second supply voltage.

In example 16, the method of example 15 may optionally include that the memory cell defines a write voltage (also referred to as programming voltage) VPP for writing the memory cell 420. Further, a difference between the first supply voltage and the second supply voltage may be in the range from about 60% to about 72% of the write voltage VPP. In particular, a difference between the first supply voltage and the second supply voltage may be substantially two-thirds (⅔) of the write voltage VPP.

According to various aspects, the memory cell (e.g. of examples 14 to 16) may be or may include a ferroelectric field-effect transistor (FeFET). According to various aspects, the memory cell (e.g. of examples 14 to 16) may include more than one ferroelectric field-effect transistor (FeFET).

Example 17 is a memory cell arrangement 500, including: a first set of memory cell drivers 500w and a second set of memory cell drivers 500sb. Each memory driver 300 of the first and second set of memory cell drivers 500w, 500sb includes: a first supply node 302 to receive a first supply voltage 302v and a second supply node 312 to receive a second supply voltage 312v, a plurality of addressing nodes 314 to receive a plurality of addressing voltages 314v, one or more driving nodes 324, and a logic circuit 301 connected to the first supply node 302, the second supply node 312, the plurality of addressing nodes 314, and the one or more driving nodes 324, wherein the logic circuit 301 includes one or more logic gates and is configured to connect via the one or more logic gates either the first supply node 302 or the second supply node 312 to the one or more driving nodes 324 in response to the plurality of addressing voltages. The memory cell arrangement 500 further includes: one or more first control-lines WL connected to the one or more driving nodes 324 of each memory cell driver 300 of the first set of memory cell drivers 500w; one or more second control-lines SL, BL connected to the one or more driving nodes 324 of each memory cell driver 300 of the second set of memory cell drivers 500sb; and a plurality of memory cells, wherein each memory cell 420 of the plurality of memory cells includes one or more first control nodes 422w and one or more second control nodes 422s, 422b, wherein the one or more first control nodes 422w and the one or more second control nodes 422s, 422b of each memory cell 420 of the plurality of memory cells are connected to the one or more first control-lines WL and the one or more second control-lines SL, BL respectively.

In example 18, the memory cell arrangement of example 17 may optionally include that each memory cell of the plurality of memory cells is unambiguously assigned to one memory cell driver 300 of the first set of memory cell drivers 500w and one memory cell driver 300 of the second set of memory cell drivers 500sb. Illustratively, each memory cell of the plurality of memory cells may be unambiguously addressable within the memory cell arrangement 500 via two corresponding memory cell drivers 300.

In example 19, the memory cell arrangement of example 17 or 18 may optionally include a voltage supply circuit configured to provide the first supply voltage 302v and the second supply voltage 312v to each memory cell driver 300 of the first set of memory cell drivers 500w, and configured to provide the first supply and the second supply voltage 312v to each memory cell driver 300 of the second set of memory cell drivers 500sb. The voltage supply circuit may be configured to provide the first supply voltage 302v and the second supply voltage 312v for each memory cell driver 300 of the first set of memory cell drivers 500w with an offset relative to the first supply voltage 302v and the second supply voltage 312v for each memory cell driver 300 of the second set of memory cell drivers 500sb.

In example 20, the memory cell arrangement of example 19 may optionally include that the plurality of memory cells define a write voltage (also referred to as programming voltage) VPP for writing one or more of the plurality of memory cells. Further, a voltage difference between the first supply voltage 302v and the second supply voltage 312v provided to each memory cell driver 300 of the first set of memory cell drivers 500w may be in the range from about 60% to about 72% of the programming voltage, in particular about ⅔ of the programming voltage. Further, a voltage difference between the first supply voltage 302v and the second supply voltage 312v provided to each memory cell driver 300 of the second set of memory cell drivers 500sb may be in the range from about 60% to about 72% of the programming voltage, in particular about ⅔ of the programming voltage.

In example 21, the memory cell arrangement of example 20 may optionally include that the offset is in the range from about 28% to about 40% of the programming voltage, in particular about ⅓ of the programming voltage.

In example 22, the memory cell arrangement of example 20 or 21 may optionally include an addressing circuit configured to provide the plurality of addressing voltages 314v for each memory cell driver 300 of the first set of memory cell drivers 500w and each memory cell driver 300 of the second set of memory cell drivers 500sb.

In example 23, the memory cell arrangement of example 22 may optionally include that the addressing circuit is configured to provide the plurality of addressing voltages 314v for each memory cell driver 300 of the first set of memory cell drivers 500w and each memory cell driver 300 of the second set of memory cell drivers 500sb to perform one or more write operations for one or more memory cells of the plurality of memory cells.

In example 24, the memory cell arrangement of example 22 or 23 may optionally include that the addressing circuit and the voltage supply circuit are configured to provide a programming voltage to the one or more memory cells with a first polarity during a first write operation (e.g. a programming operation for an n-type FeFET, wherein the n-type FeFET is set to the LVT state, e.g. an erase operation for a p-type FeFET, wherein the p-type FeFET is set to the HVT state) and/or with a second polarity during a second write operation (e.g. an erase operation for an n-type FeFET, wherein the n-type FeFET is set to the HVT state, e.g. a programming operation for a p-type FeFET, wherein the p-type FeFET is set to the LVT state), wherein the first polarity is opposite the second polarity.

In example 25, the memory cell arrangement of any one of examples 22 to 24 may optionally include that the addressing circuit and the voltage supply circuit are configured to provide, for a write operation, the plurality of addressing voltages 314v to the memory cell drivers 300 before the first and second supply voltages 302v, 312v are provided to the memory cell drivers 300.

Example 26 is a method for operating a memory cell arrangement, the memory cell arrangement including a plurality of memory cells. The method including: providing a first supply voltage to a first supply node of one or more memory cell drivers of a first set of memory cell drivers; providing a second supply voltage to a second supply node of the one or more memory cell drivers of the first set of memory cell drivers; providing a third supply voltage to a first supply node of one or more memory cell drivers of a second set of memory cell drivers; providing a fourth supply voltage to a second supply node of the one or more memory cell drivers of the second set of memory cell drivers; and operating one or more memory cells of the plurality of memory cells via one or more memory cell drivers of the first set of memory cell drivers and one or more memory cell drivers of the second set of memory cell drivers. Each memory cell driver of the first and second set of memory cell drivers may be configured as described in examples 1 to 13. The four supply voltages may be four output voltages $V_{out}$(1, 2, 3, 4) generated by a voltage supply circuit 100.

In example 27, the method of example 26 may optionally include that the plurality of memory cells define a programming voltage for writing the plurality of memory cells. Further, a voltage difference between the first supply voltage and the second supply voltage may be in the range from about 60% to about 72% of the programming voltage, in particular about ⅔ of the programming voltage. Further, a voltage difference between the third supply voltage and the fourth supply voltage may be in the range from about 60% to about 72% of the programming voltage, in particular about ⅔ of the programming voltage.

In example 28, the method of example 27 may optionally include that the first supply voltage and the second supply voltage are provided with an offset relative to the third supply voltage and the fourth supply voltage.

In example 29, the method of example 28 may optionally include that the offset is in the range from about 28% to about 40% of the programming voltage. In particular, the offset may be about ⅓ of the programming voltage.

In example 30, the method of any one of examples 26 to 29 may optionally include that operating the one or more memory cells includes applying a first voltage ramping scheme and a second voltage ramping scheme to perform a first write operation and a second write operation respectively.

In example 31, the method of example 30 may optionally include that the first voltage ramping scheme includes ramping the first supply voltage to a first predefined output voltage level, the second supply voltage to a third predefined output voltage level, the third supply voltage to a second predefined output voltage level, and the fourth supply voltage to a fourth predefined output voltage level. Further, the second voltage ramping scheme may include ramping the first supply voltage to the second predefined output voltage level, the second supply voltage to the fourth predefined output voltage level, the third supply voltage to the first predefined output voltage level, and the fourth supply voltage to the third predefined output voltage level.

In example 32, the method of example 31 may optionally include that the first predefined output voltage level is greater than the second predefined output voltage level, the second predefined output voltage level is greater than the third predefined output voltage level, and the third predefined output voltage level is greater than the fourth predefined output voltage level.

In example 33, the method of example 31 or 32 may optionally include that a difference between the first predefined output voltage level and the fourth predefined output voltage level is substantially equal to the programming voltage.

In example 34, the method of example 30 may optionally include that, in the case that the first voltage ramping scheme is applied, the first supply voltage is greater than the third supply voltage, the third supply voltage is greater than the second supply voltage, and the second supply voltage is greater than the fourth supply voltage. Further, in the case that the second voltage ramping scheme is applied, the third supply voltage may be greater than the first supply voltage, the first supply voltage may be greater than the fourth supply voltage, and the fourth supply voltage may be greater than the second supply voltage.

In example 35, the method of example 34 may optionally include that, in the case that the first voltage ramping scheme is applied, a voltage difference between the first supply voltage and the fourth supply voltage is substantially equal to the programming voltage. Further, in the case that the second voltage ramping scheme is applied, a voltage difference between the third supply voltage and the second supply voltage may be substantially equal to the programming voltage.

In example 36, the method of example 34 or 35 may optionally include that, in the case that the first voltage ramping scheme is applied, a voltage difference between the first supply voltage and the third supply voltage is substantially equal to one-third of a programming voltage, a voltage difference between the third supply voltage and the second supply voltage is substantially equal to one-third of the programming voltage, and a voltage difference between the second supply voltage and the fourth supply voltage is substantially equal to one-third of the programming voltage. Further, in the case that the second voltage ramping scheme is applied, a voltage difference between the third supply voltage and the first supply voltage may be substantially equal to one-third of the programming voltage, a voltage difference between the first supply voltage and the fourth supply voltage may be substantially equal to one-third of the programming voltage, and a voltage difference between the fourth supply voltage and the second supply voltage may be substantially equal to one-third of the programming voltage.

Various technical applications may benefit from a generation of voltages according to predefined requirements. As exemplarily shown herein, a VPP/3 scheme may include various voltages used for FeFET write operations. It may be beneficial that the voltages of the VPP/3 scheme are generated in such a way that they are dependent from one another and such that it is ensured that the generated voltages do not exceed a predefined voltage ratio during the complete write operation. The voltage supply circuit 100, as exemplarily described herein, may allow for a generation of the voltages with a predefined voltage ratio relative to one another, wherein the respective predefined voltage ratio is not exceeded throughout the write operation. The predefined voltage ratio is not exceeded independently from a distribution of the loads drawn from the respective voltage stages of the voltage supply circuit 100. According to various aspects, each controlled voltage converter circuit 101-(1, ..., n) of the voltage supply circuit 100 may define a voltage stage that corresponds to a predefined output voltage level.

According to various aspects, the voltage supply circuit 100 (e.g. as described herein) may allow for a consideration of different loads at the output nodes. Since each voltage stage of the voltage supply circuit 100 may be dependent from another voltage stage, an inaccurate voltage ratio (e.g. during the ramp phase) can be avoided. Therefore, an undesired writing of the FeFETs can be avoided, since, for example, the VPP/3 ratio is not disturbed by the different loads.

According to various aspects, the various voltages may be generated based on a coupled control of various voltage converters. As an example, a set of coupled feedback loops may be used to control a set of charge pumps, see, for example, FIG. 13A. According to various aspects, each output voltage $V_{out}$ may be generated via a corresponding charge pump, whereas the output voltage $V_{out}$ of a charge pump may be used as a reference voltage (or, in other words, an input voltage) of another charge pump. This dependency may ensure that the output voltage of higher voltage stages (i.e. the higher output voltages) does not exceed the VPP/3 voltage, which may be beneficial for disturb free program operations in the FeFET memory technology.

FIG. 13A shows a voltage supply circuit 100 in a schematic view, according to various aspects. The voltage supply circuit 100 may include a plurality of charge pumps CP(1, ..., n) to pump up (e.g. to ramp) a plurality of different output voltages $V_{out}(1, ..., n)$ to corresponding predefined output voltage levels $L_{Vout}(1, ..., n)$. Each of the plurality of charge pumps CP(1, ..., n) may be controlled via a corresponding control circuit. The control circuit may be or may include a feedback loop. The respective control circuit (e.g. the feedback loop) may include a voltage divider X(1, ..., n) and a comparator I(1, ..., n).

In the example shown in FIG. 13A, the voltage supply circuit 100 includes three charge pumps CP1, CP2, CP3 configured to provide three different positive output voltages $V_{out}(1)$, $V_{out}(2)$, $V_{out}(3)$ and one charge pump CPN configured to provide a negative output voltage $V_{out}(N)$. The voltage supply circuit 100 may include one input node 100$i$ to receive an input voltage $V_{in}$ and four output nodes 100$v$-1, 100$v$-2, 100$v$-3, 100$v$-N to output the generated output voltages $V_{out}(1)$, $V_{out}(2)$, $V_{out}(3)$, $V_{out}(N)$. However, other combinations of charge pumps may be provided in a similar way, see, for example, FIGS. 2A to 2G. The ramping of the output voltages $V_{out}(1)$, $V_{out}(2)$, $V_{out}(3)$, $V_{out}(N)$ is exemplarily illustrated in FIG. 13B and FIG. 13C.

As illustrated in FIG. 13A, the input voltage $V_{in}$ may be used (as a reference voltage) to control the first output voltage $V_{out}(1)$ of the first charge pump CP1. The control of the first charge pump CP1 may be carried out via a first voltage divider X1 and a first comparator I1. The first voltage divider X1 and the first comparator I1 may be configured to provide a first feedback loop for the first charge pump CP1. While the input voltage $V_{in}$ is higher than the negative input of the first comparator I1, the first charge pump CP1 may operate and may pump up the first output voltage $V_{out}(1)$. The first output voltage $V_{out}(1)$ may be fed back through the first voltage divider X1 to the negative input of the first comparator I1. In other words, the first voltage divider X1 is configured to provide a first feedback voltage to the first comparator I1, the first feedback voltage representing a fraction of the first output voltage $V_{out}(1)$. The first voltage divider X1 may scale down the first output voltage $V_{out}(1)$ to provide the first feedback voltage with a first fixed ratio. The first feedback voltage divided from the first output voltage $V_{out}(1)$ may be compared via the first comparator I1 with the input voltage $V_{in}$. If the first feedback voltage reaches the input voltage $V_{in}$, the output of the first comparator I1 may get low and the first charge pump CP1 may stop pumping up the first output voltage $V_{out}(1)$.

According to various aspects, the first output voltage $V_{out}(1)$ of the first charge pump CP1 may be a reference voltage to control the operation of a second charge pump CP2. The control of the second charge pump CP2 may be carried out via a second voltage divider X2 and a second comparator I2. The first output voltage $V_{out}(1)$ of the first charge pump CP1 may be provided to the positive input of the second comparator I2. The second voltage divider X2 and the second comparator I2 may be configured to provide a second feedback loop for the second charge pump CP2. While the first output voltage $V_{out}(1)$ is higher than the negative input of the second comparator I2, the second charge pump CP2 may operate and may pump up the second output voltage $V_{out}(2)$. The second output voltage $V_{out}(2)$ may be fed back through the second voltage divider X2 to the negative input of the second comparator I2. In other words, the second voltage divider X2 is configured to provide a second feedback voltage to the second comparator I2, the second feedback voltage representing a fraction of the second output voltage $V_{out}(2)$. The second voltage divider X2 may scale down the second output voltage $V_{out}(2)$ to provide the second feedback voltage with a second fixed ratio. The second feedback voltage divided from the second output voltage $V_{out}(2)$ may be compared via the second comparator I2 with the first output voltage $V_{out}(1)$. If the second feedback voltage reaches the first output voltage $V_{out}(1)$, the output of the second comparator I2 may get low and the second charge pump CP2 may stop pumping up the second output voltage $V_{out}(2)$.

According to various aspects, the voltage supply circuit 100 may include one or more additional charge pumps that may be configured in a similar way as described for the first charge pump CP1 and the second charge pump CP2, e.g. a third charge pump CP3 may receive the second output voltage $V_{out}(2)$ as a reference and may provide a third output voltage $V_{out}(3)$ that is dependent from the second output voltage $V_{out}(2)$, and, optionally, a fourth charge pump CP4 may receive the third output voltage $V_{out}(3)$ as a reference and may provide a fourth output voltage that is dependent from the third output voltage $V_{out}(3)$, and so on. This architecture may ensure that the higher voltages depend on the lower voltages, e.g. each voltage may depend on the next lower voltage.

According to various aspects, in addition or alternatively to the generation of a plurality of positive output voltages (e.g. $V_{out}(1)$, $V_{out}(2)$, $V_{out}(3)$) the voltage supply circuit 100 may include one or more charge pumps CPN configured to generate a negative output voltage $V_{out}(N)$. According to various aspects, the negative output voltage $V_{out}(N)$ may be generated by inverting a positive output voltage $V_{out}(1)$, $V_{out}(2)$, $V_{out}(3)$ of a corresponding charge pump CP1, CP2, CP3. As an example, a feedback signal may be generated from one of the positive output voltages (e.g. from $V_{out}(1)$ by a voltage divider XN corresponding to the charge pump CPN that generates the negative output voltage $V_{out}(N)$, as illustrated in FIG. 13A). The feedback signal may be provided to the positive input of a comparator IN to control the charge pump CPN to pump up the negative output voltage $V_{out}(N)$. The negative input of the comparator IN may be coupled to ground voltage. The ground voltage may be also referred to as 0 V or as ground potential. However, any other suitable base voltage $V_{base}$ may be used instead of the ground voltage.

Further, the principle of implementing and/or operating the voltage supply circuit 100 may be extended to any desired number of positive and/or negative output voltages.

According to various aspects, FIG. 13A shows exemplarily charge pumps to pump up the output voltages. However, any other suitable voltage converter may be used in the same or in a similar way to provide the output voltages in a controlled manner.

According to various aspects, the respective voltage divider X(1, . . . , n) of the voltage supply circuit 100 may include a resistive voltage divider or a resistive voltage divider network, a capacitive voltage divider or a capacitive voltage divider network, and/or any other voltage divider or voltage divider network.

According to various aspects, FIG. 13B shows a voltage ramping 1300b for a case where all loads connected to the output nodes 100v-(1, . . . , n) of the voltage supply circuit 100 may be substantially balanced. The ramping of all output voltages $V_{out}(1)$, $V_{out}(2)$, $V_{out}(3)$, $V_{out}(N)$ may be synchronous, e.g. may start and end at the same time.

Figure 13C:
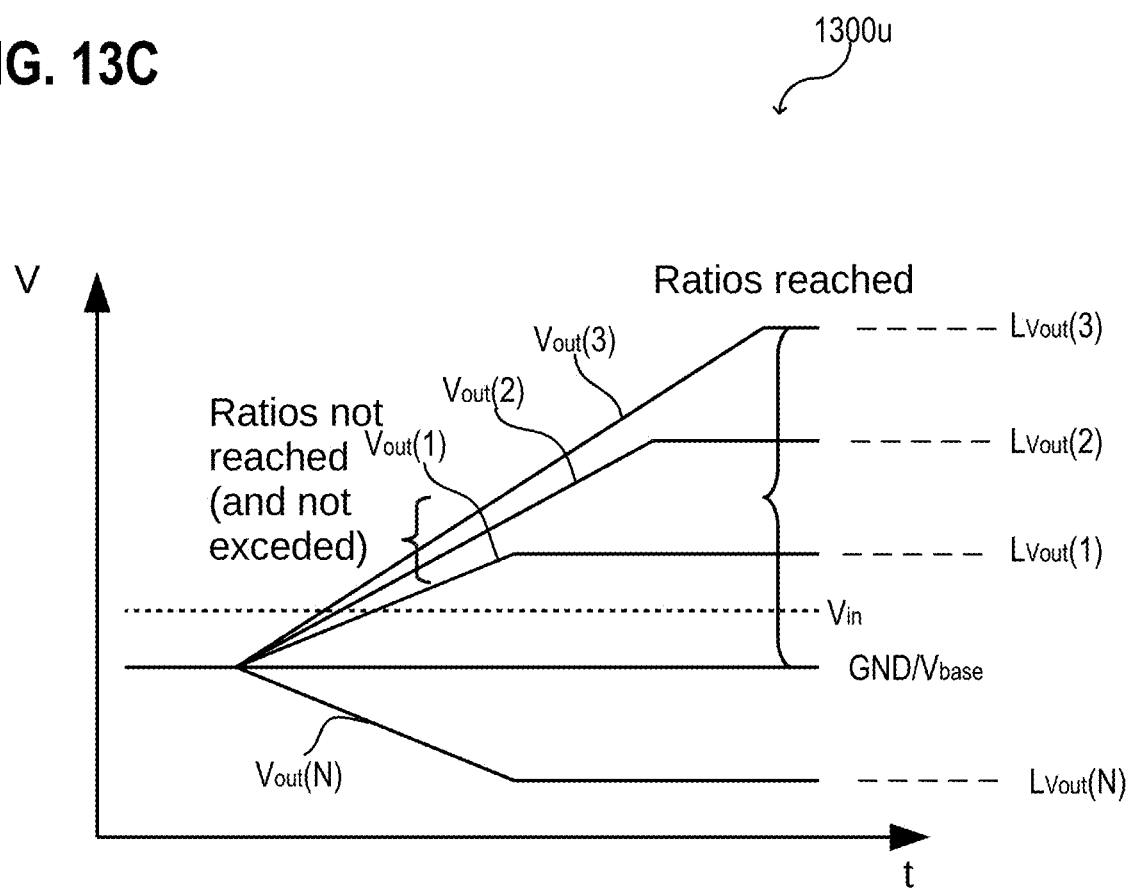

FIG. 13C shows a voltage ramping 1300u for the case that the loads that are connected to the output nodes 100v-(1, . . . , n) of the voltage supply circuit 100 may be substantially unbalanced. As an example, the higher the load, the higher the voltage level of the respective output node 100v-(1, . . . , n). In this case, the configuration and/or operation of the voltage supply circuit 100 may ensure that the voltage ratios ($V_{out}(1):V_{out}(2)$, $V_{out}(2):V_{out}(3)$, $V_{out}(1):V_{out}(N)$) are limited to the ratio of the corresponding predefined output voltage levels $L_{Vout}(1, \ldots, n)$, e.g. neither during the ramping nor after the ramping. The predefined output voltage levels $L_{Vout}(1, \ldots, n)$ may be defined by the voltage dividers X1, X2, X3, XN and the base voltage $V_{base}$.

According to various aspects, the voltage supply circuit 100 may allow for a generation of a plurality of different output voltages (e.g. $V_{out}(1)$, $V_{out}(2)$, $V_{out}(3)$) for a memory cell arrangement, wherein a voltage difference between an output voltage (e.g. $V_{out}(2)$) and the next higher output voltage (e.g. $V_{out}(3)$) or next lower output voltage (e.g. $V_{out}(1)$) may not exceed VPP/3, wherein VPP is a programming voltage of one or more memory cells of the memory cell arrangement.

As shown, for example, in FIG. 13C, the ramping of all output voltages $V_{out}(1)$, $V_{out}(2)$, $V_{out}(3)$, $V_{out}(N)$ may start at the same time and may end at different times, wherein the predefined ratios between the respective output voltages are not exceeded during the ramping and are reached after the ramping of all output voltages $V_{out}(1)$, $V_{out}(2)$, $V_{out}(3)$, $V_{out}(N)$ is finished. The start and the end of a ramping of the respective output voltage may be defined by the start and end of the change (e.g. increase or decrease) of the respective output voltage. A ramp rate may be defined by the fraction of $\Delta V$ and $\Delta t$ ($\Delta V/\Delta t$), wherein $\Delta V$ is the change in the voltage and $\Delta t$ is the time associated with the change in the voltage.

In the following, various examples are provided that may include one or more aspects described above with reference to the voltage supply circuit 100, the memory cell driver 300, the memory cell arrangement, 400, 500 and methods thereof.

Example 1 is a voltage supply circuit 100, including: an input node 100i to receive an input voltage $V_{in}$; a first output node 100v-1 to output a first output voltage $V_{out}(1)$; a second output node 100v-2 to output a second output voltage $V_{out}(2)$; a first controlled voltage converter circuit 101-1 including a first voltage converter 102-1 and a first control circuit 104-1, wherein the first control circuit 104-1 is configured to control the first voltage converter 102-1 to generate the first output voltage $V_{out}(1)$ in response to the received input voltage $V_{in}$; and a second controlled voltage converter circuit 101-2 including a second voltage converter 102-2 and a second control circuit 104-2, wherein the second control circuit 104-2 is configured to control the second voltage converter 102-2 to output the second output voltage $V_{out}(2)$ in response to the generated first output voltage $V_{out}(1)$.

In example 2, the voltage supply circuit 100 of example 1 may further include that the first control circuit 104-1 is configured to control the first voltage converter 102-1 to generate the first output voltage $V_{out}(1)$, the first output voltage $V_{out}(1)$ having a predefined relationship to the received input voltage $V_{in}$.

In example 3, the voltage supply circuit 100 of example 1 or 2 may further include that the second control circuit 104-2 is configured to control the second voltage converter 102-2 to generate the second output voltage $V_{out}(2)$, the second output voltage $V_{out}(2)$ having a predefined relationship to the generated first output voltage $V_{out}(1)$.

In example 4, the voltage supply circuit 100 of example 3 may further include that the predefined relationship of the first output voltage $V_{out}(1)$ to the second output voltage $V_{out}(2)$ includes a predefined limitation of a ratio of the first output voltage $V_{out}(1)$ to the second output voltage $V_{out}(2)$.

In example 5, the voltage supply circuit 100 of any one of examples 1 to 4, further including: a third output node 100v-3 to output a third output voltage $V_{out}(3)$; and a third controlled voltage converter circuit 101-3 including a third voltage converter 102-3 and a third control circuit 104-3, wherein the third control circuit 104-3 is configured to control the third voltage converter 102-3 to generate the third output voltage $V_{out}(3)$ in response to the generated first output voltage $V_{out}(1)$ and/or second output voltage $V_{out}(2)$.

In example 6, the voltage supply circuit 100 of example 5 may further include that the third control circuit 104-3 is configured to control the third voltage converter 102-3 to generate the third output voltage $V_{out}(3)$, the third output voltage $V_{out}(3)$ having a predefined relationship to the generated first output voltage $V_{out}(1)$ and/or second output voltage $V_{out}(2)$.

In example 7, the voltage supply circuit 100 of example 6 may further include that the predefined relationship of the second output voltage $V_{out}(2)$ to the third output voltage $V_{out}(3)$ includes a predefined limitation of a ratio of the second output voltage $V_{out}(2)$ to the third output voltage $V_{out}(3)$.

In example 8, the voltage supply circuit 100 of any one of examples 5 to 7, further including: a fourth output node 100v-4 to output a fourth output voltage $V_{out}(4)$; and a fourth controlled voltage converter circuit 101-4 including a fourth voltage converter 102-4 and a fourth control circuit 104-4, wherein the fourth control circuit 104-4 is configured to control the fourth voltage converter 102-4 to generate the fourth output voltage $V_{out}(4)$ in response to the generated first output voltage $V_{out}(1)$, second output voltage $V_{out}(2)$, and/or third output voltage $V_{out}(3)$.

In example 9, the voltage supply circuit 100 of example 8 may further include that the fourth control circuit 104-4 is configured to control the fourth voltage converter 102-4 to generate the fourth output voltage $V_{out}(4)$, the fourth output voltage $V_{out}(4)$ having a predefined relationship to the generated first output voltage $V_{out}(1)$, second output voltage $V_{out}(2)$, and/or third output voltage $V_{out}(3)$.

In example 10, the voltage supply circuit 100 of example 9 may further include that the predefined relationship of the third output voltage $V_{out}(3)$ to the fourth output voltage $V_{out}(4)$ includes a predefined limitation of a ratio of the third output voltage $V_{out}(3)$ to the fourth output voltage $V_{out}(4)$.

In example 11, the voltage supply circuit 100 of any one of examples 4, 7, and 10 may further include that each of the control circuits 104-(1, . . . , n) includes at least one voltage divider $X(1, \ldots n)$ defining the respective predefined limitation.

In example 12, the voltage supply circuit 100 of any one of examples 1 to 11 may further include that the first control circuit 104-1 is configured as a closed-loop control circuit having a first voltage divider X1 to generate a first feedback voltage $V_f(1)$ from the first output voltage $V_{out}(1)$ and a first comparator I1 to compare the first feedback voltage $V_f(1)$ with the input voltage $V_{in}$, wherein the first control circuit 104-1 is configured to control the first voltage converter 102-1, CP1 to output the first output voltage $V_{out}(1)$ in response to a first control voltage $V_c(1)$ generated by the first comparator I1.

In example 13, the voltage supply circuit 100 of any one of examples 1 to 12 may further include that the second control circuit 104-2 is configured as a closed-loop control circuit having a second voltage divider X2 to generate a second feedback voltage $V_f(2)$ from the second output voltage $V_{out}(2)$ and a second comparator 12 to compare the second feedback voltage $V_f(2)$ with the first output voltage $V_{out}(1)$, wherein the second control circuit 104-2 is configured to control the second voltage converter 102-2, CP2 to output the second output voltage $V_{out}(2)$ in response to a second control voltage $V_c(2)$ generated by the second comparator 12.

In example 14, the voltage supply circuit 100 of any one of examples 1 to 12 may further include that the second control circuit 104-2 is configured as a closed-loop control circuit having a second voltage divider XN to generate a second feedback voltage $V_f(N)$ from the second output voltage $V_{out}(N)$ and a second comparator IN to compare the second feedback voltage $V_f(N)$ with a base voltage $V_{base}$, wherein the second control circuit 104-2 is configured to control the second voltage converter 102-2, CPN to output the second output voltage $V_{out}(N)$ in response to a second control voltage $V_c(N)$ generated by the second comparator IN.

In example 15, the voltage supply circuit 100 of example 14 may further include that the base voltage is the ground voltage.

In example 16, the voltage supply circuit 100 of any one of examples 5 to 7 may further include that the third control circuit 104-3 is configured as a closed-loop control circuit having a third voltage divider X3 to generate a third feedback voltage $V_f(3)$ from the third output voltage $V_{out}(3)$ and a third comparator 13 to compare the third feedback voltage $V_f(3)$ with the second output voltage $V_{out}(2)$, wherein the third control circuit 104-3 is configured to control the third voltage converter 102-3, CP3 to output the third output voltage $V_{out}(3)$ in response to a third control voltage $V_c(3)$ generated by the third comparator 13.

In example 17, the voltage supply circuit 100 of any one of examples 8 to 10 may further include that the fourth control circuit 104-4 is configured as a closed-loop control circuit having a fourth voltage divider to generate a fourth feedback voltage from the fourth output voltage $V_{out}(4)$ and a comparator to compare the fourth feedback voltage with the third output voltage $V_{out}(3)$, wherein the fourth control circuit 104-4 is configured to control the fourth voltage converter 102-4 to output the fourth output voltage $V_{out}(4)$ in response to a fourth control voltage generated by the fourth comparator.

Example 18 is a voltage supply circuit 100, including: a first controlled voltage converter circuit 101-1 including a first voltage converter 102-1 and a first control circuit 104-1, wherein the first control circuit 104-1 is configured to receive an input voltage $V_{in}$ and control the first voltage converter 102-1 to output a first output voltage $V_{out}(1)$ having a predefined relationship to the received input voltage $V_{in}$; and a second controlled voltage converter circuit 101-2 including a second voltage converter 102-2 and a second control circuit 104-2, wherein the second control circuit 104-2 is configured to receive the first output voltage $V_{out}(1)$ and control the second voltage converter 102-2 to output a second output voltage $V_{out}(2)$ having a predefined relationship to the received first output voltage $V_{out}(1)$.

Example 19 is a memory cell arrangement, including: a first set of memory cell drivers 500w configured to selectively supply a supply voltage of a set of supply voltages VPPWL, VNNWL, VPPBL, VNNBL to one or more first control-lines WL for operating one or more memory cells 420; a second set of memory cell drivers 500sb configured to selectively supply another supply voltage of the set of supply voltages VPPWL, VNNWL, VPPBL, VNNBL to one or more second control-lines SL, BL for operating the one or more memory cells 420; and a voltage supply circuit 100 configured to generate the set of supply voltages VPPWL, VNNWL, VPPBL, VNNBL, the voltage supply circuit 100 including: a first controlled voltage converter circuit 101-1 including a first voltage converter 102-1 and a first control circuit 104-1, wherein the first control circuit 104-1 is configured to receive an input voltage $V_{in}$ and control the first voltage converter 102-1 to generate a first supply voltage of the set of supply voltages in response to the received input voltage $V_{in}$; a second controlled voltage converter circuit 101-2 including a second voltage converter 102-2 and a second control circuit 104-2, wherein the second control circuit 104-2 is configured to receive the first supply voltage and control the second voltage converter 102-2 to generate a second supply voltage of the set of supply voltages in response to the received first supply voltage; and a third controlled voltage converter circuit 101-3 including a third voltage converter 102-3 and a third control circuit 104-3, wherein the third control circuit 104-3 is configured to receive the first or the second supply voltage and control the third voltage converter 102-3 to output a third supply voltage of the set of supply voltages in response to the received first or second supply voltage; and a supply circuit configured to provide a fourth supply voltage of the set of supply voltages.

In example 20, the memory cell arrangement of example 19 may further include that the fourth supply voltage is a base voltage, wherein, preferably, the base voltage is at a constant voltage level.

In example 21, the memory cell arrangement of example 19 may further include that the supply circuit is a fourth controlled voltage converter circuit 101-4 including a fourth voltage converter 102-4 and a fourth control circuit 104-4, wherein the fourth control circuit 104-4 is configured to receive the first supply voltage, the second supply voltage, or the third supply voltage and control the fourth voltage converter 102-4 to output the fourth supply voltage in response to the received first supply voltage, second supply voltage, or third supply voltage.

Example 22 is a method for operating a memory cell arrangement 400, 500, the method including: providing a set of supply voltages VPPWL, VNNWL, VPPBL, VNNBL to one or more sets 500w, 500sb of memory cell drivers 300 to write (e.g., to program and/or erase) one or more memory cells 420 of the memory cell arrangement 400, 500; wherein providing the set of supply voltages includes: ramping a first supply voltage of the set of supply voltages to a first predefined output voltage level, and ramping a second supply voltage of the set of supply voltages to a second predefined output voltage level dependent upon the first supply voltage, the first predefined output voltage level and the second predefined output voltage level defining a first predefined ratio, wherein, during the ramping of the first supply voltage and during the ramping of the second supply voltage, a first ratio of the first supply voltage to the second supply voltage is equal to or less than the first predefined ratio.

In example 23, the method of example 22 may further include that providing the set of supply voltages further includes: ramping a third supply voltage of the set of supply voltages to a third predefined output voltage level dependent upon the second supply voltage, the second predefined output voltage level and the third predefined output voltage level defining a second predefined ratio, wherein, during the ramping of the second supply voltage and during the ramping of the third supply voltage, a second ratio of the second supply voltage to the third supply voltage is equal to or less than the second predefined ratio.

In example 24, the method of example 23 may further include that n providing the set of supply voltages further includes: ramping a fourth supply voltage of the set of supply voltages to a fourth predefined output voltage level dependent upon the third supply voltage, the third predefined output voltage level and the fourth predefined output voltage level defining a third predefined ratio, wherein, during the ramping of the third supply voltage and during the ramping of the fourth supply voltage, a third ratio of the third supply voltage to the fourth supply voltage is equal to or less than the third predefined ratio.

In example 25, the method of example 22 may further include that providing the set of supply voltages further includes: ramping a third supply voltage of the set of supply voltages to a third predefined output voltage level dependent upon the first supply voltage, the first predefined output voltage level and the third predefined output voltage level defining a second predefined ratio, wherein, during the ramping of the first supply voltage and during the ramping of the third supply voltage, a second ratio of the first supply voltage to the third supply voltage is equal to or less than the second predefined ratio.

In example 26, the method of example 25 may further include that providing the set of supply voltages further includes: providing a fourth supply voltage of the set of supply voltages, the fourth supply voltage is constant at a fourth predefined output voltage level.

In example 27, the method of example 23 or 26 may further include that the first predefined output voltage level, the second predefined output voltage level, the third predefined output voltage level are defined by the fourth supply voltage.

In example 28, the method of any one of examples 22 to 27 may further include that a lowest and a highest of the predefined output voltage levels are defined by a write voltage VPP of the one or more memory cells.

In example 29, the method of example 28 may further include that a voltage difference between the lowest and the highest of the predefined output voltage levels is the write voltage VPP.

In example 30, the method of example 28 or 29 may further include that a voltage difference between the lowest and a second lowest of the predefined output voltage levels is one third of the write voltage VPP.

In example 31, the method of any one of examples 28 to 30 may further include that a voltage difference between the highest and a second highest of the predefined output voltage levels is one third of the write voltage VPP.

In example 32, the method of any one of examples 28 to 31 may further include that a voltage difference between the second lowest and the second highest of the predefined output voltage levels is one third of the write voltage VPP.

Example 33 is a method for operating a memory cell arrangement, the method including: connecting, via a first memory cell driver, a first supply node to a first control-line of the memory cell arrangement and, via a second memory cell driver, a second supply node to a second control-line of the memory cell arrangement to write (e.g., to program and/or erase) one or more memory cells of the memory cell arrangement; and ramping a first supply voltage supplied to the first supply node to a first predefined output voltage level with a first ramp rate and ramping a second supply voltage supplied to the second supply node dependent upon the ramping of the first supply voltage to a second predefined voltage with a second ramp rate to write one or more memory cells of the memory cell arrangement, wherein a ratio of the second ramp rate to the first ramp rate is equal to or less than a ratio of second predefined output voltage level to the first predefined output voltage level.

In example 34, the method of example 33 may further include that the second supply voltage is higher than the first supply voltage and wherein the second ramp rate is greater than the first ramp rate.

Example 35 is a voltage supply circuit 100, including: an input node 100i to receive an input voltage $V_{in}$; a plurality of output nodes 100v-(1, . . . , n) to output a plurality of output voltages $V_{out}$(1, . . . , n); a first controlled voltage converter circuit 101-1 configured to generate a first output voltage $V_{out}$(1) of the plurality of output voltages $V_{out}$(1, . . . , n), the first output voltage $V_{out}$(1) having a predefined relationship to the input voltage $V_{in}$; a second controlled voltage converter circuit 101-2 configured to generate a second output voltage $V_{out}$(2), $V_{out}$(N) of the plurality of output voltages $V_{out}$(1, . . . , n), the second output voltage $V_{out}(2)$, $V_{out}(N)$ having a predefined relationship to the first output voltage $V_{out}(1)$.

According to various aspects, the respective controlled voltage converter circuit 101-1 may be configured to generate an output voltage that is higher than the input voltage provided thereto. According to various aspects, the respective controlled voltage converter circuit 101-1 may include or may be a charge pump.

Example 35 is a memory cell arrangement 500, comprising: a first set of memory cell drivers 500w configured to selectively supply a supply voltage of a set of supply voltages VPPWL, VNNWL, VPPBL, VNNBL to one or more first control-lines WL for operating one or more memory cells 420; a second set of memory cell drivers 500sb configured to selectively supply another supply voltage of the set of supply voltages VPPWL, VNNWL, VPPBL, VNNBL to one or more second control-lines SL, BL for operating the one or more memory cells 420; and a voltage supply circuit 100 as described herein configured to generate at least two supply voltages VPPWL, VNNWL, VPPBL, VNNBL of the set of supply voltages VPPWL, VNNWL, VPPBL, VNNBL.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory cell arrangement, comprising:
a first set of memory cell drivers configured to selectively supply a supply voltage of a set of supply voltages to one or more first control-lines for operating one or more memory cells;
a second set of memory cell drivers configured to selectively supply another supply voltage of the set of supply voltages to one or more second control-lines for operating the one or more memory cells; and
a voltage supply circuit configured to generate the set of supply voltages, the voltage supply circuit comprising:
a first controlled voltage converter circuit comprising a first voltage converter and a first control circuit, wherein the first control circuit is configured to receive an input voltage and control the first voltage converter to generate a first supply voltage of the set of supply voltages in response to the received input voltage;
a second controlled voltage converter circuit comprising a second voltage converter and a second control circuit, wherein the second control circuit is configured to receive the first supply voltage and control the second voltage converter to generate a second supply voltage of the set of supply voltages in response to the received first supply voltage; and
a third controlled voltage converter circuit comprising a third voltage converter and a third control circuit, wherein the third control circuit is configured to receive the first or the second supply voltage and control the third voltage converter to output a third supply voltage of the set of supply voltages in response to the received first or second supply voltage; and
a supply circuit configured to provide a fourth supply voltage of the set of supply voltages.

2. The memory cell arrangement of claim 1,
wherein the first control circuit is configured as a closed-loop control circuit having a first voltage divider to generate a first feedback voltage from the first supply voltage and a first comparator to compare the first feedback voltage with the input voltage, wherein the first control circuit is configured to control the first voltage converter to output the first supply voltage in response to a first control voltage generated by the first comparator;
wherein the second control circuit is configured as a closed-loop control circuit having a second voltage divider to generate a second feedback voltage from the second supply voltage and a second comparator to compare the second feedback voltage with the first supply voltage, wherein the second control circuit is configured to control the second voltage converter to output the second supply voltage in response to a second control voltage generated by the second comparator; and
wherein the third control circuit is configured as a closed-loop control circuit having a third voltage divider to generate a third feedback voltage from the third supply voltage and a third comparator to compare the third feedback voltage with the second supply voltage, wherein the third control circuit is configured to control the third voltage converter to output the third supply voltage in response to a third control voltage generated by the third comparator.

3. The memory cell arrangement of claim 1,
wherein the fourth supply voltage is a base voltage, wherein, preferably, the base voltage is at a constant voltage level.

4. The memory cell arrangement of claim 1,
wherein the supply circuit is a fourth controlled voltage converter circuit comprising a fourth voltage converter and a fourth control circuit, wherein the fourth control circuit is configured to receive the first supply voltage, the second supply voltage, or the third supply voltage and control the fourth voltage converter to output the fourth supply voltage in response to the received first supply voltage, second supply voltage, or third supply voltage.

5. A voltage supply circuit, comprising:
an input node to receive an input voltage;
a first output node to output a first output voltage;
a second output node to output a second output voltage;
a first controlled voltage converter circuit comprising a first voltage converter and a first control circuit, wherein the first control circuit is configured to control the first voltage converter to generate the first output voltage in response to the received input voltage; and
a second controlled voltage converter circuit comprising a second voltage converter and a second control circuit, wherein the second control circuit is configured to control the second voltage converter to output the second output voltage in response to the generated first output voltage,
wherein the first control circuit is configured as a closed-loop control circuit having a first voltage divider to generate a first feedback voltage from the first output voltage and a first comparator to compare the first feedback voltage with the input voltage, wherein the first control circuit is configured to control the first voltage converter to output the first output voltage in response to a first control voltage generated by the first comparator; and wherein the second control circuit is configured as a closed-loop control circuit having a second voltage divider to generate a second feedback voltage from the second output voltage and a second comparator to compare the second feedback voltage with the first output voltage, wherein the second control circuit is configured to control the second voltage converter to output the second output voltage in response to a second control voltage generated by the second comparator.

6. The voltage supply circuit of claim 5,
wherein the first control circuit is configured to control the first voltage converter to generate the first output voltage, the first output voltage having a predefined relationship to the received input voltage; and
wherein the second control circuit is configured to control the second voltage converter to generate the second output voltage, the second output voltage having a predefined relationship to the generated first output voltage.

7. The voltage supply circuit of claim 6,
wherein the predefined relationship of the first output voltage to the second output voltage comprises a predefined limitation of a ratio of the first output voltage to the second output voltage.

8. The voltage supply circuit of claim 7,
wherein each of the control circuits comprises at least one voltage divider defining the respective predefined limitation.

9. The voltage supply circuit of claim 5, further comprising:
a third output node to output a third output voltage; and
a third controlled voltage converter circuit comprising a third voltage converter and a third control circuit, wherein the third control circuit is configured to control the third voltage converter to generate the third output voltage in response to the generated first output voltage and/or second output voltage.

10. The voltage supply circuit of claim 9,
wherein the third control circuit is configured to control the third voltage converter to generate the third output voltage, the third output voltage having a predefined relationship to the generated first output voltage and/or second output voltage.

11. The voltage supply circuit of claim 10,
wherein the predefined relationship of the second output voltage to the third output voltage comprises a predefined limitation of a ratio of the second output voltage to the third output voltage.

* * * * *